(12) United States Patent  
Murata

(10) Patent No.: US 7,427,821 B2
(45) Date of Patent: Sep. 23, 2008

(54) PIEZOELECTRIC ELEMENT, INKJET RECORDING HEAD AND INKJET RECORDING DEVICE

(75) Inventor: Michiaki Murata, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 530 days.

(21) Appl. No.: 11/072,671

(22) Filed: Mar. 4, 2005

(65) Prior Publication Data

US 2005/0275316 A1    Dec. 15, 2005

(30) Foreign Application Priority Data

Jun. 14, 2004    (JP)    ............... 2004-175660
Jan. 5, 2005    (JP)    ............... 2005-000708

(51) Int. Cl.
*H01L 41/08*    (2006.01)
(52) U.S. Cl. .................................... 310/328
(58) Field of Classification Search ................ 310/328, 310/311, 364, 365; 347/68–72; *H01L 41/08; B41J 2/045*
See application file for complete search history.

(56) References Cited

U.S. PATENT DOCUMENTS

| 6,345,887 B1 * | 2/2002 | Sato ............................. 347/72 |
| 6,533,402 B2 * | 3/2003 | Miyata ......................... 347/68 |
| 6,572,223 B2 * | 6/2003 | Delametter et al. ........... 347/47 |

FOREIGN PATENT DOCUMENTS

| JP | 11-77999 | * | 3/1999 |
| JP | 2003-63000 | * | 5/2003 |

* cited by examiner

*Primary Examiner*—Darren Schuberg
*Assistant Examiner*—Karen B Addison
(74) *Attorney, Agent, or Firm*—Fildes & Outland, P.C.

(57) ABSTRACT

The present invention provides a piezoelectric element including: a piezoelectric body; and two electrodes between which the piezoelectric body is interposed, wherein the piezoelectric element is covered by a low water permeable insulating film serving as a protective film.

19 Claims, 19 Drawing Sheets

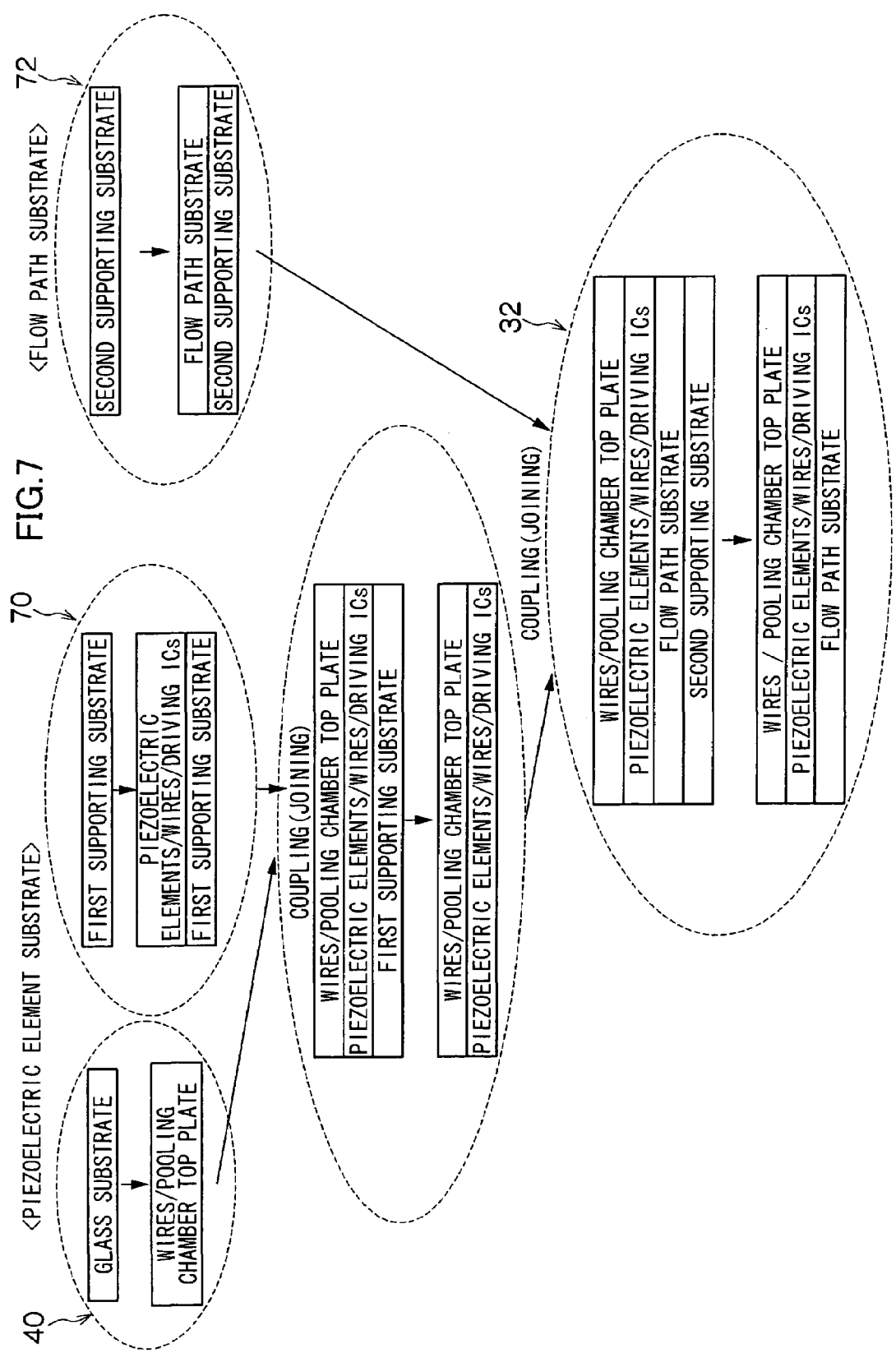

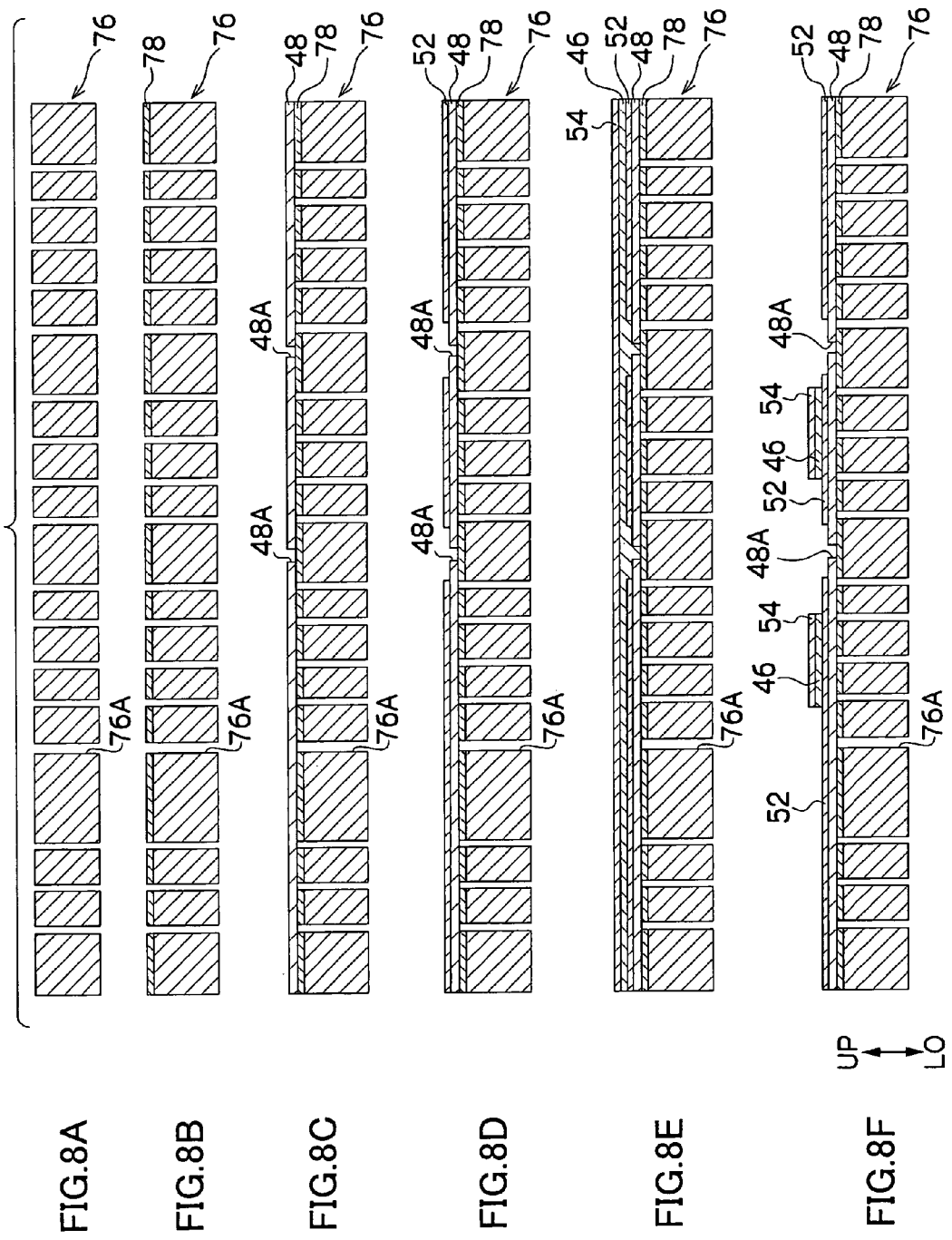

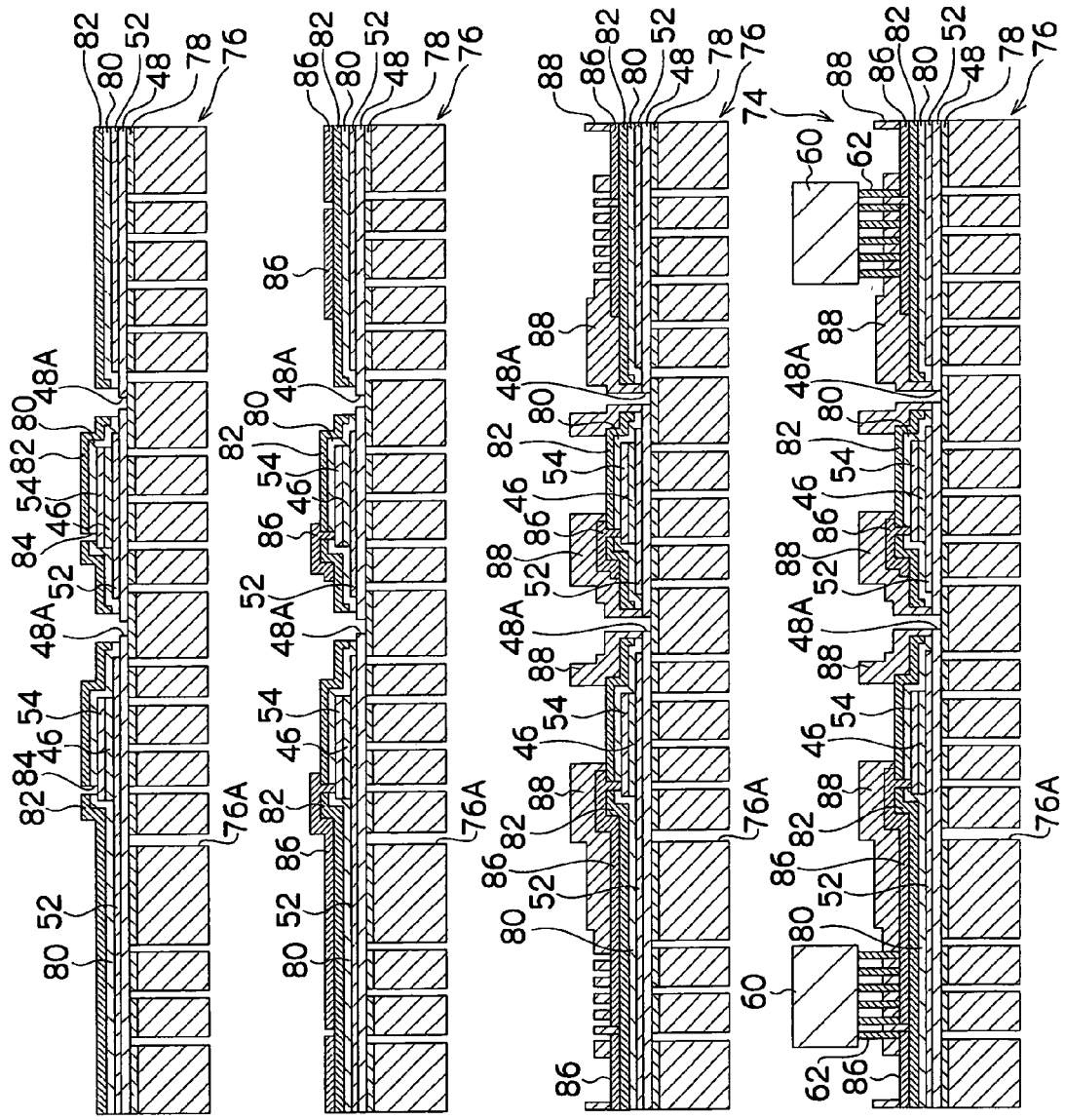

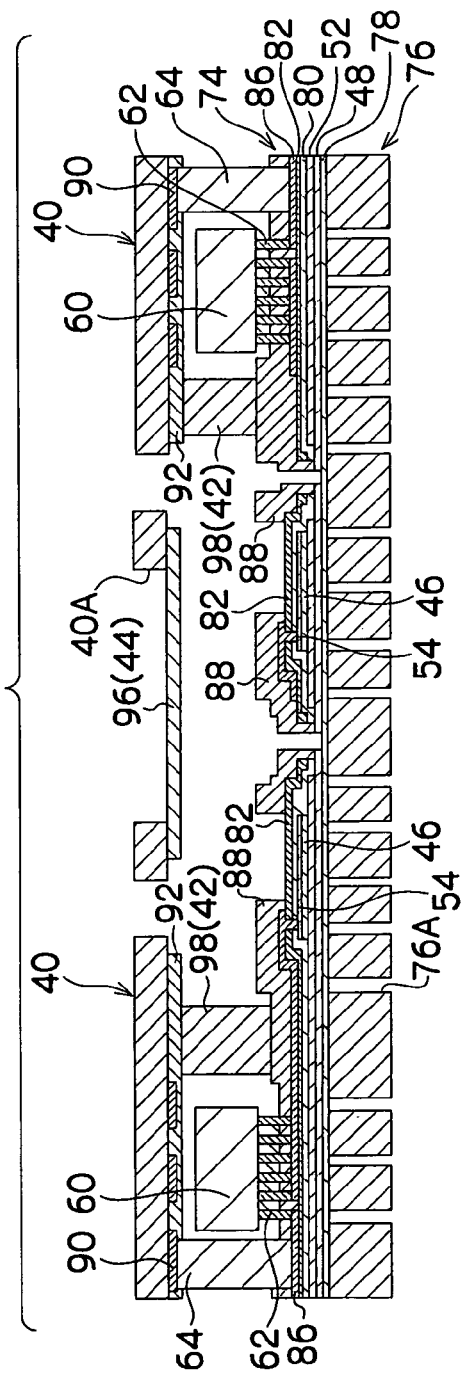
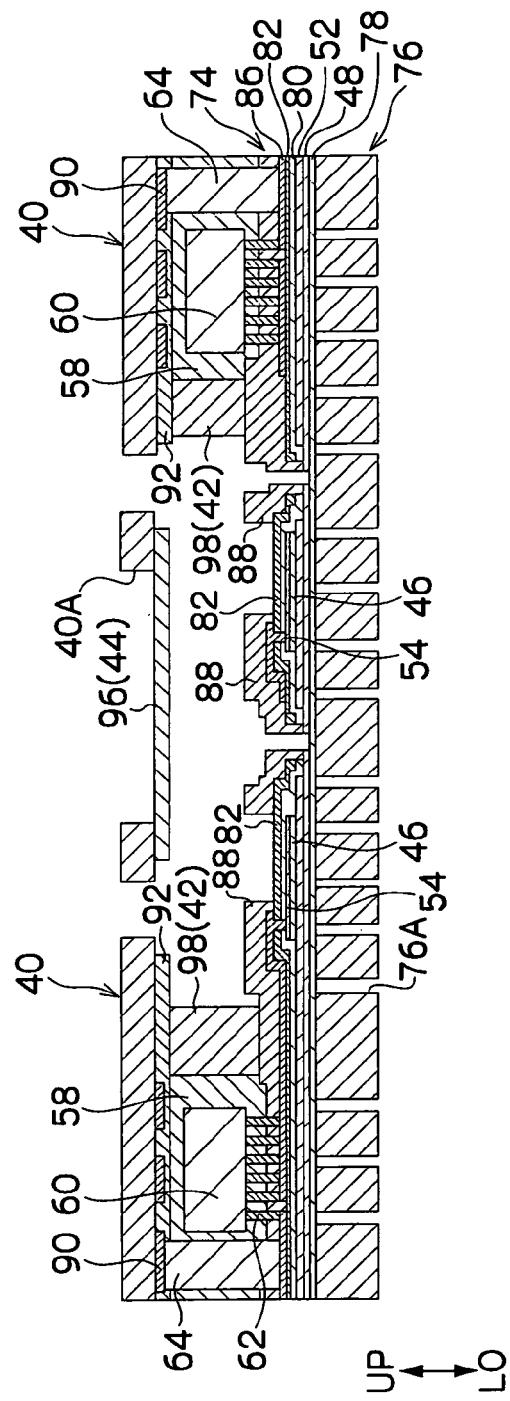
FIG.10A
FIG.10B

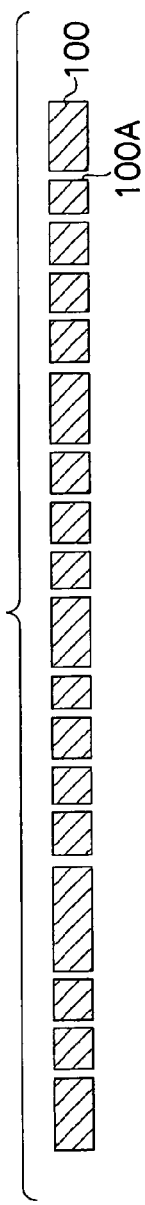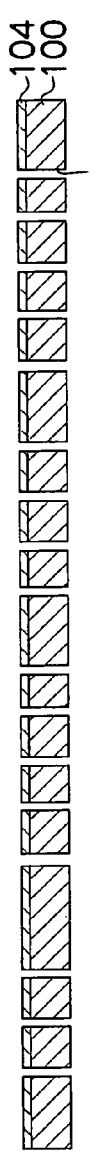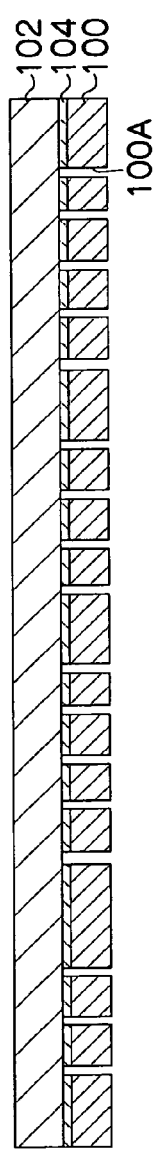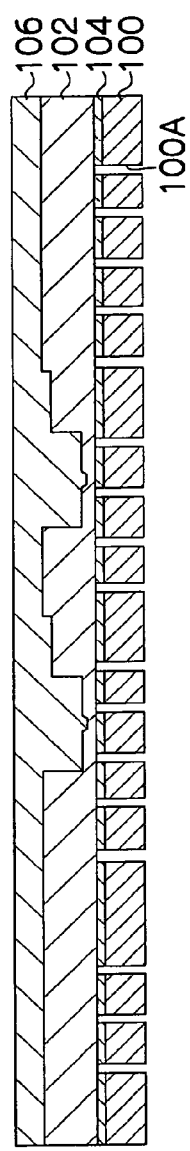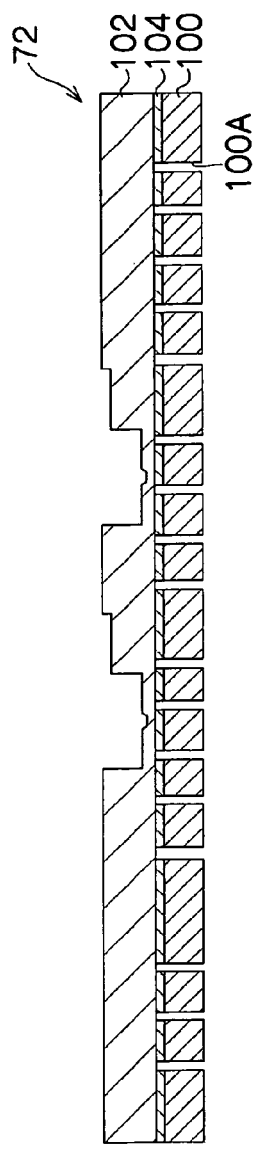

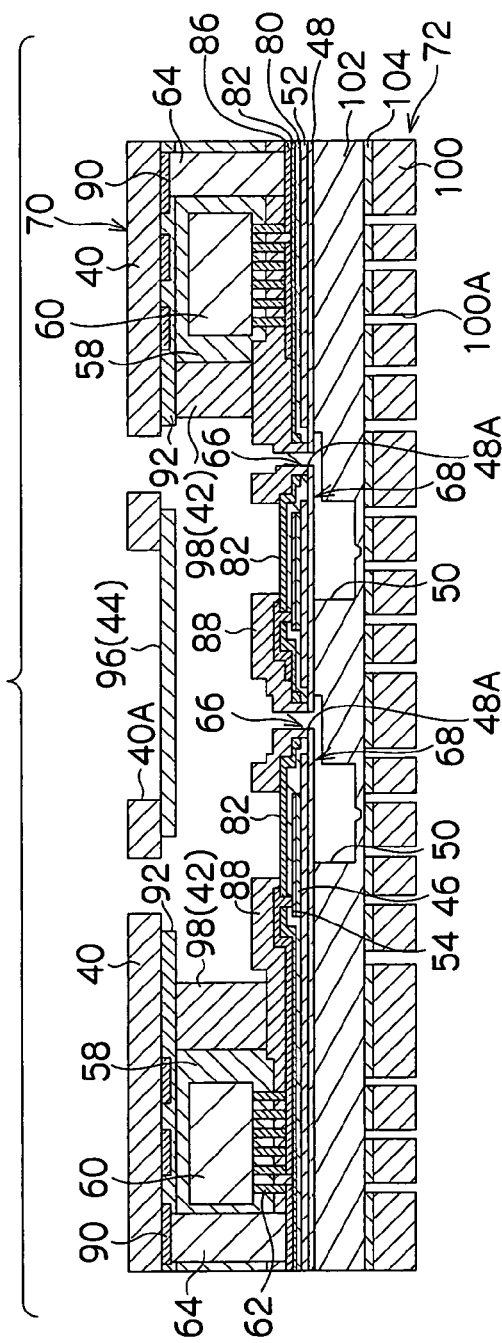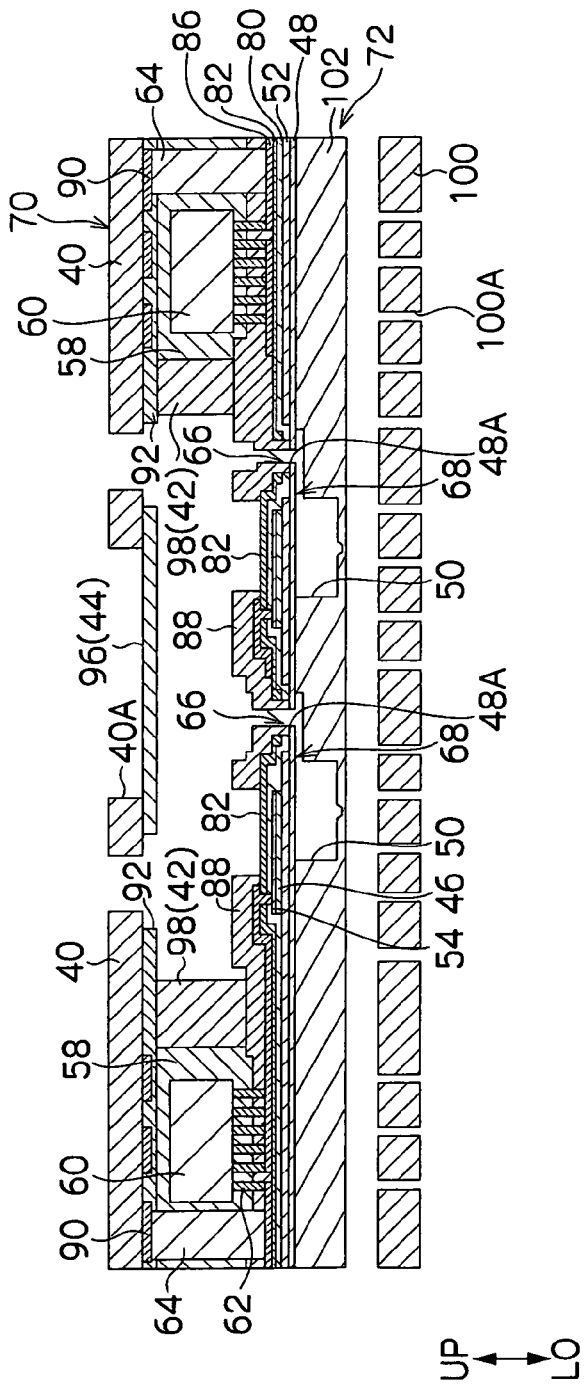
FIG.12A
FIG.12B

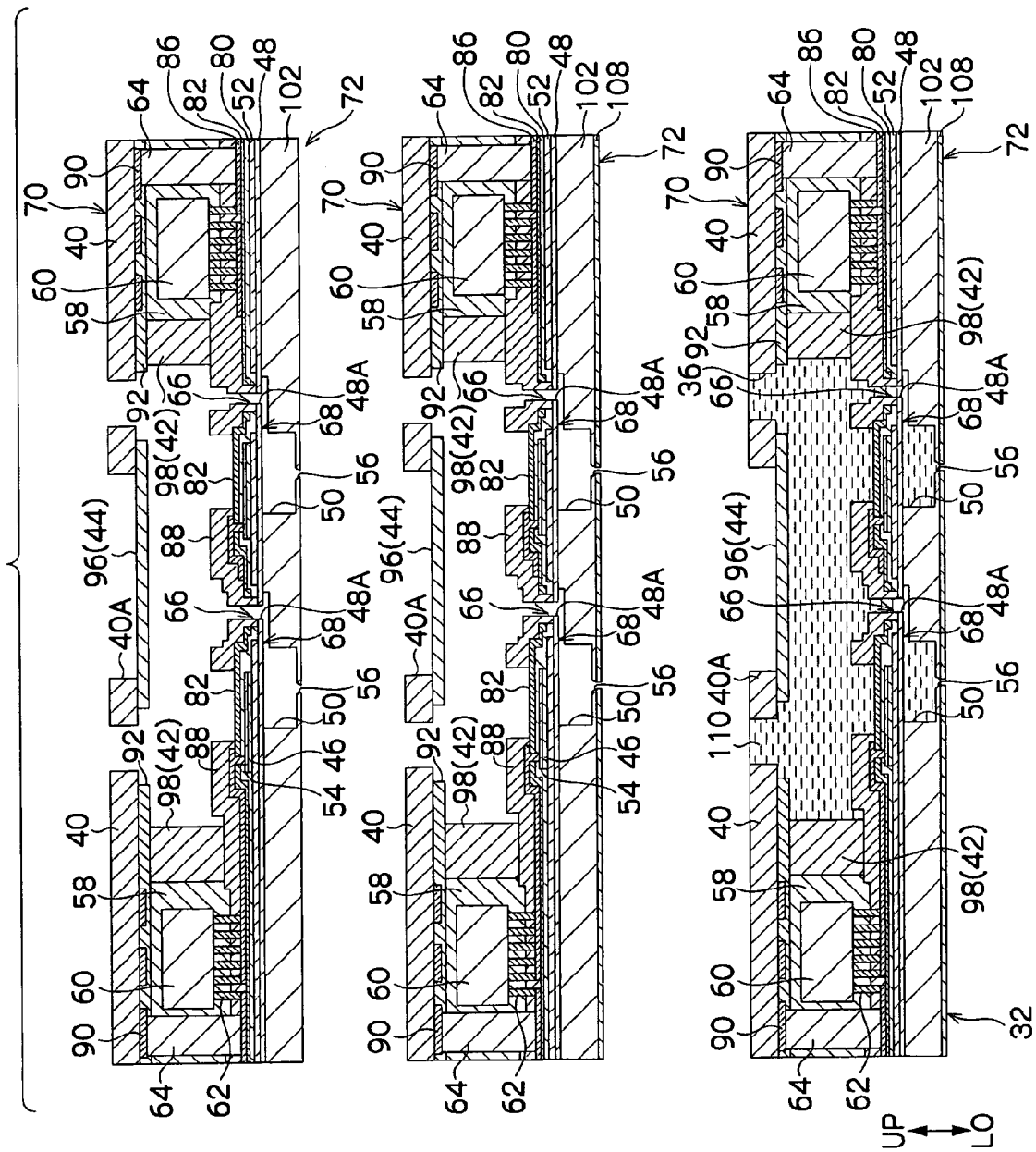

PIEZOELECTRIC ELEMENT, INKJET RECORDING HEAD AND INKJET RECORDING DEVICE

CROSS-REFERENCE TO RELATED APPLICATION

This application claims priority under 35 USC 119 from Japanese Patent Application Nos. 2004-175660 and 2005-708, the disclosures of which is incorporated by reference herein.

BACKGROUND OF THE INVENTION

1. Field of the Invention

The present invention relates to an inkjet recording head which has a nozzle which ejects ink drops, a pressure chamber which communicates with the nozzle and in which ink is filled, a vibrating plate structuring a portion of the pressure chamber, an ink pooling chamber which pools ink to be supplied to the pressure chamber via an ink flow path, and a piezoelectric element which displaces the vibrating plate, and to an inkjet recording device which uses this inkjet recording head. The present invention also relates to the piezoelectric element used therein.

2. Description of the Related Art

There have conventionally been known inkjet recording devices in which characters, images or the like are printed onto a recording medium such as a recording sheet or the like which is conveyed-in along a subscanning direction, by ejecting ink drops selectively from plural nozzles of an inkjet recording head (hereinafter, simply called "recording head" upon occasion) which moves reciprocatingly in a main scanning direction.

Such an inkjet recording device has piezoelectric system recording heads, thermal system recording heads, or the like. For example, in the case of a piezoelectric system recording head, as shown in FIGS. 14 and 15, a piezoelectric element (an actuator which converts electrical energy into mechanical energy) 206 is provided at a pressure chamber 204 to which ink 200 is supplied from an ink tank via an ink pooling chamber 202. The piezoelectric element 206 flexurally deforms in a concave form so as to reduce the volume of the pressure chamber 204, thereby applying pressure to the ink 200 therein and ejecting the ink 200 as an ink drop 200A from a nozzle 208 which communicates with the pressure chamber 204.

Various proposals have been made for the purpose of improving the ink-resistance and the moisture-resistance of the structural members of the recording head (and the piezoelectric element in particular).

For example, Japanese Patent Application Laid-Open (JP-A) No. 3-166953 proposes covering the electrode surface of a piezoelectric element with an organic high polymer compound, so as to ensure the ink-resistance. JP-A No. 10-226071 proposes forming a silicon oxide or polyimide resin film on a piezoelectric element, so as to improve the moisture-resistance. JP-A No. 11-334061 discloses providing a flexible sealing film on the top portion of a piezoelectric element in order to improve the moisture-resistance of the piezoelectric element and prevent impeding of displacement of the piezoelectric element at the same time. JP-A No. 7-10157 proposes successively layering an organic film for mitigating stress, an inorganic film for improving the moisture-resistance, and an organic film for making the surface smooth, on the pressure chamber side surface of the piezoelectric element so as to protect this surface of the piezoelectric element. JP-A No. 2001-88296 discloses using an electrically-conductive metal oxide film at an electrode in order to improve the moisture-resistance.

However, due to the current demands for high technology, even these proposals are insufficient, and further improvements are needed.

SUMMARY OF THE INVENTION

Thus, in view of the aforementioned, the present invention provides a piezoelectric element having sufficiently improved moisture-resistance. Further, the present invention provides a piezoelectric element in which both ink-resistance and moisture-resistance are improved simultaneously. The present invention also provides an inkjet recording head and an inkjet recording device using these piezoelectric elements.

In a first aspect of the present invention, a piezoelectric element includes: a piezoelectric body; and two electrodes between which the piezoelectric body is interposed, and the piezoelectric element is covered by a low water permeable insulating film serving as a protective film.

In accordance with the present aspect, because the piezoelectric element is covered by the low water permeable insulating film, sufficient moisture-resistance can be imparted to the piezoelectric element.

In a second aspect of the present invention, a piezoelectric element includes: a piezoelectric body; and two electrodes between which the piezoelectric body is interposed, and the piezoelectric element is covered by a protective film in which a low water permeable insulating film and a resin insulating film are successively layered.

In accordance with the present aspect, the piezoelectric element is covered by the protective film, in which the low water permeable insulating film and the resin insulating film are successively layered. Therefore, moisture-resistance is imparted to the piezoelectric element by the low water permeable insulating film serving as the lower layer of the protective film, ink-resistance is imparted to the piezoelectric element by the resin insulating film serving as the upper layer of the protective film, and both ink-resistance and moisture-resistance can be improved simultaneously.

In a third aspect of the present invention, the resin insulating film of the piezoelectric element based on the above-described second aspect is structured by one of a polyimide resin film, a polyamide resin film, an epoxy resin film, a polyurethane resin film, and a silicone resin film.

In accordance with the present aspect, the aforementioned types of resin are used as the resin insulating film. Sufficient ink-resistance can thereby be imparted to the piezoelectric element.

In a fourth aspect of the present invention, the low water permeable insulating film based on the above-described first or second aspect has a dangling bond density of no lower than $1 \times 10^{18}$ cm$^{-3}$.

In accordance with the present aspect, sufficient moisture-resistance can be imparted to the piezoelectric element by making the dangling bond density of the low water permeable insulating film fall within the aforementioned range. Further, as a relatively thin film thickness is enough for obtaining the total number of dangling bonds which sufficiently impart moisture-resistance, there are few mechanical constraints on the piezoelectric element, and impeding of displacement of the piezoelectric element is prevented.

In a fifth aspect of the present invention, the low water permeable insulating film based on the above-described first or second aspect is formed by an ECR (Electron Cyclotron Resonance) method.

In the present aspect, the low water permeable insulating film is formed by an ECR (Electron Cyclotron Resonance) method. In this way, film formation at a low temperature is possible, and the proportion of dangling bonds within the film which react with other impurity atoms (hydrogen) and are extinguished is reduced. Therefore, a film having the needed bond density can be suitably obtained.

In a sixth aspect of the present invention, the low water permeable insulating film based on the above-described first or second aspect is formed by one of a silicon oxide film, a silicon nitride film, and a silicon oxynitride film.

In accordance with the present aspect, by using a film of the aforementioned materials as the low water permeable insulating film, the cost can be lowered as compared with a case in which, for example, another metal oxide film is used at the electrode.

In a seventh aspect of the present invention, a first wire, which is connected to one of the electrodes based on the above-described first or second aspect, is provided, and the protective film covers the first wire and functions as an interlayer insulating film.

In accordance with the present aspect, the protective film is provided to cover one of the piezoelectric element and the wire connected to the piezoelectric element, and is made to function as an interlayer insulating film of the wire connected to the piezoelectric element. The structure can thereby be simplified.

In an eighth aspect of the present invention, a second wire, which is connected to one of the electrodes, is provided on the protective film based on the above-described first or second aspect, and a second resin insulating film is provided so as to cover the second wire.

In accordance with the present aspect, the second resin insulating film can cover the wire in a state in which the adhesion (the bonding strength) thereof with the protective film (i.e., the resin insulating film) is high. Therefore, penetration of ink from the boundary surface thereof is effectively prevented, and corrosion of the wire is prevented.

In a ninth aspect of the present invention, the second resin insulating film based on the above-described eighth aspect is structured by a resin film of the same type as the resin insulating film provided as the protective film.

In accordance with the present aspect, by using the same type of material for the second resin insulating film and the resin insulating film serving as the protective film, the adhesion (bonding strength) is more effectively improved.

In a tenth aspect of the present invention, an inkjet recording head includes: a nozzle ejecting ink drops; a pressure chamber which communicates with the nozzle and in which ink is filled; a vibrating plate structuring a portion of the pressure chamber; an ink pooling chamber pooling ink to be supplied to the pressure chamber via an ink flow path; and a piezoelectric element displacing the vibrating plate, wherein the piezoelectric element is the piezoelectric element based on any of the above-described first through ninth aspects.

In an eleventh aspect of the present invention, an inkjet recording device is provided with the inkjet recording head based on the above-described tenth aspect.

As described above, the present invention can provide a piezoelectric element having sufficiently improved moisture-resistance. Further, the present invention can provide a piezoelectric element in which both the ink-resistance and the moisture-resistance are improved simultaneously. Moreover, the present invention can provide an inkjet recording head and an inkjet recording device using these piezoelectric elements.

BRIEF DESCRIPTION OF THE DRAWINGS

FIG. 7 is a diagram explaining the overall processes for manufacturing the inkjet recording head;

FIGS. 8A through 8J are diagrams explaining steps (A) through (J) of manufacturing a piezoelectric element substrate;

FIGS. 10A through 10D are diagrams explaining steps (A) through (D) of joining the top plate to the piezoelectric element substrate;

FIGS. 11A through 11E are diagrams explaining processes of manufacturing a flow path substrate;

FIGS. 12A through 12E are diagrams explaining steps (A) through (E) of joining the flow path substrate to the piezoelectric element substrate;

DETAILED DESCRIPTION OF THE INVENTION

Figure 1:
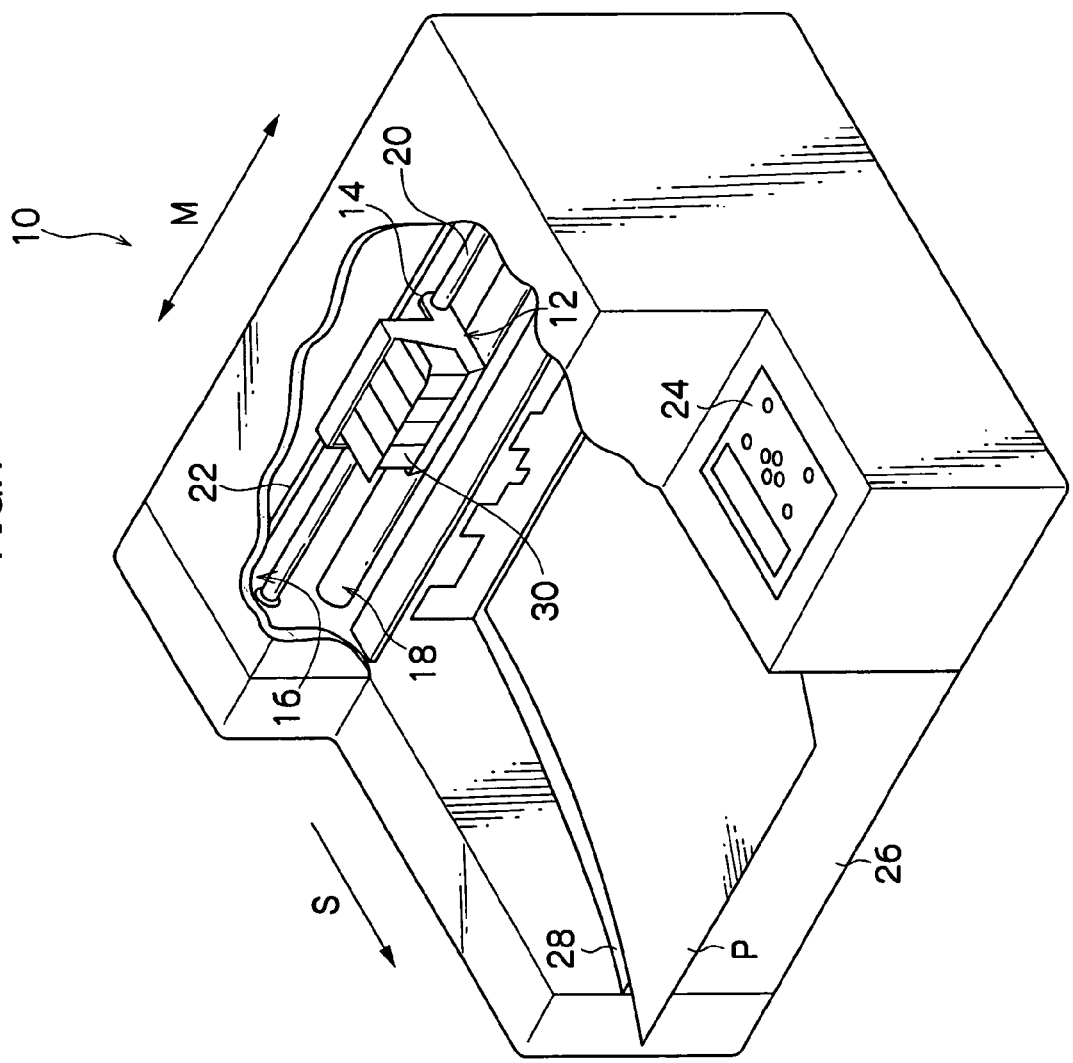
FIG. 1 is a schematic perspective view of an inkjet recording device.

Hereinafter, an embodiment of the present invention will be described in detail on the basis of the drawings. Explanation will be given in which a recording sheet P is used as a recording medium. The conveying direction of the recording sheet P in an inkjet recording device 10 is the subscanning direction and is denoted by arrow S, and the direction orthogonal to this conveying direction is the main scanning direction and is denoted by arrow M. Further, in the drawings, when arrow UP and arrow LO are shown, they express the upward direction and the downward direction, respectively, and when up and down are to be expressed, they correspond to these arrows, respectively.

First, a summary of the inkjet recording device 10 will be described. As shown in FIG. 1, the inkjet recording device 10 has a carriage 12 in which are installed inkjet recording units 30 (inkjet recording heads 32) of black, yellow, magenta and cyan. A pair of brackets 14 project from the side of the carriage 12 which is the upstream side in the conveying direction of the recording sheet P. Open holes 14A which are round (see FIG. 2) are formed in the brackets 14. A shaft 20, which spans in the main scanning direction, is inserted through the open holes 14A.

A driving pulley (not shown) and a slave pulley (not shown), which structure a main scanning mechanism 16, are disposed at the both ends in the main scanning direction. A portion of a timing belt 22, which is trained around the driving pulley and the slave pulley and which travels in the main scanning direction, is fixed to the carriage 12. Accordingly, the carriage 12 is supported so as to be able to move reciprocatingly in the main scanning direction.

A sheet feed tray 26, in which the recording sheets P before image printing are placed in a bundle, is provided at the inkjet recording device 10. A sheet discharge tray 28 is provided above the sheet feed tray 26. The recording sheets P, on which images have been printed by the inkjet recording heads 32, are discharged out onto the sheet discharge tray 28. Also provided is a subscanning mechanism 18 formed from a discharging roller and a conveying roller which conveys the recording sheets P, which are fed-out one-by-one from the sheet feed tray 26, at a predetermined pitch in the subscanning direction.

In addition, a control panel 24 for carrying out various types of settings at the time of printing, a maintenance station (not shown), and the like are provided at the inkjet recording device 10. The maintenance station is structured so as to include a capping member, a suction pump, a dummy jet receptacle, a cleaning mechanism, and the like, and carries out maintenance operations such as suctioning and recovering, dummy jetting, cleaning, and the like.

Figure 2:
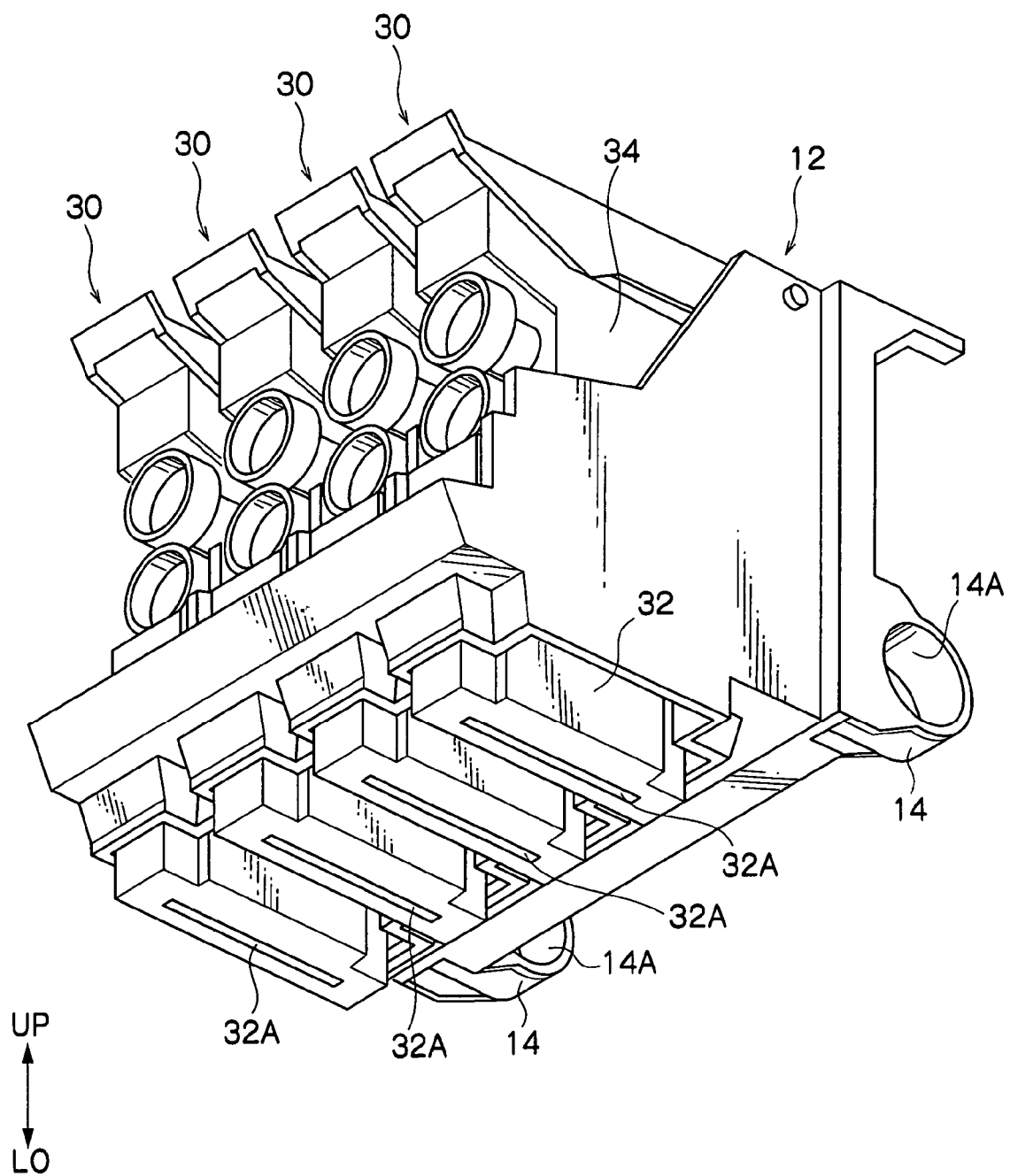
FIG. 2 is a schematic perspective view of inkjet recording units installed in a carriage.

As shown in FIG. 2, at the inkjet recording unit 30 of each color, the inkjet recording head 32 and an ink tank 34, which supplies ink to the inkjet recording head 32, are structured integrally. The inkjet recording unit 30 is installed in the carriage 12 such that plual nozzles 56 (see FIG. 3), which are formed in an ink ejecting surface 32A at the center of the bottom surface of the inkjet recording head 32, face the recording sheet P.

Accordingly, due to the inkjet recording heads 32 selectively ejecting ink drops from the nozzles 56 onto the recording sheet P while the inkjet recording heads 32 are moved in the main scanning direction by the main scanning mechanism 16, a portion of an image based on image data is recorded at a predetermined band region.

When movement of one time in the main scanning direction is completed, the recording sheet P is conveyed by a predetermined pitch in the subscanning direction by the subscanning mechanism 18. A portion of the image based on the image data is recorded on the next band region while the inkjet recording heads 32 (the inkjet recording units 30) are again moved in the main scanning direction (in the direction opposite to that previously). By repeating this operation plural times, the entire image which is based on the image data is recorded on the recording sheet P in full color.

Figure 3:
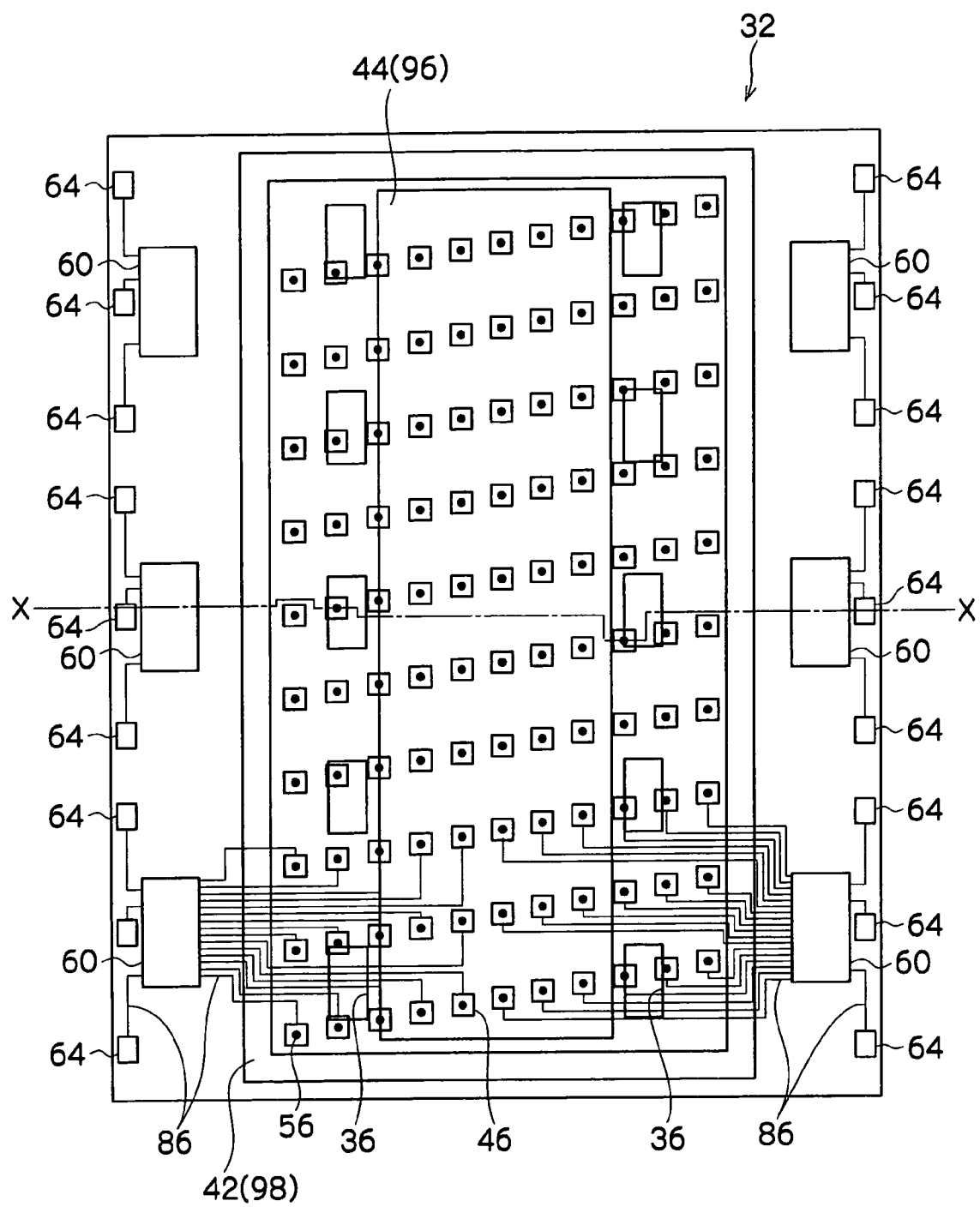
FIG. 3 is a schematic plan view showing the structure of an inkjet recording head.
Figure 4:
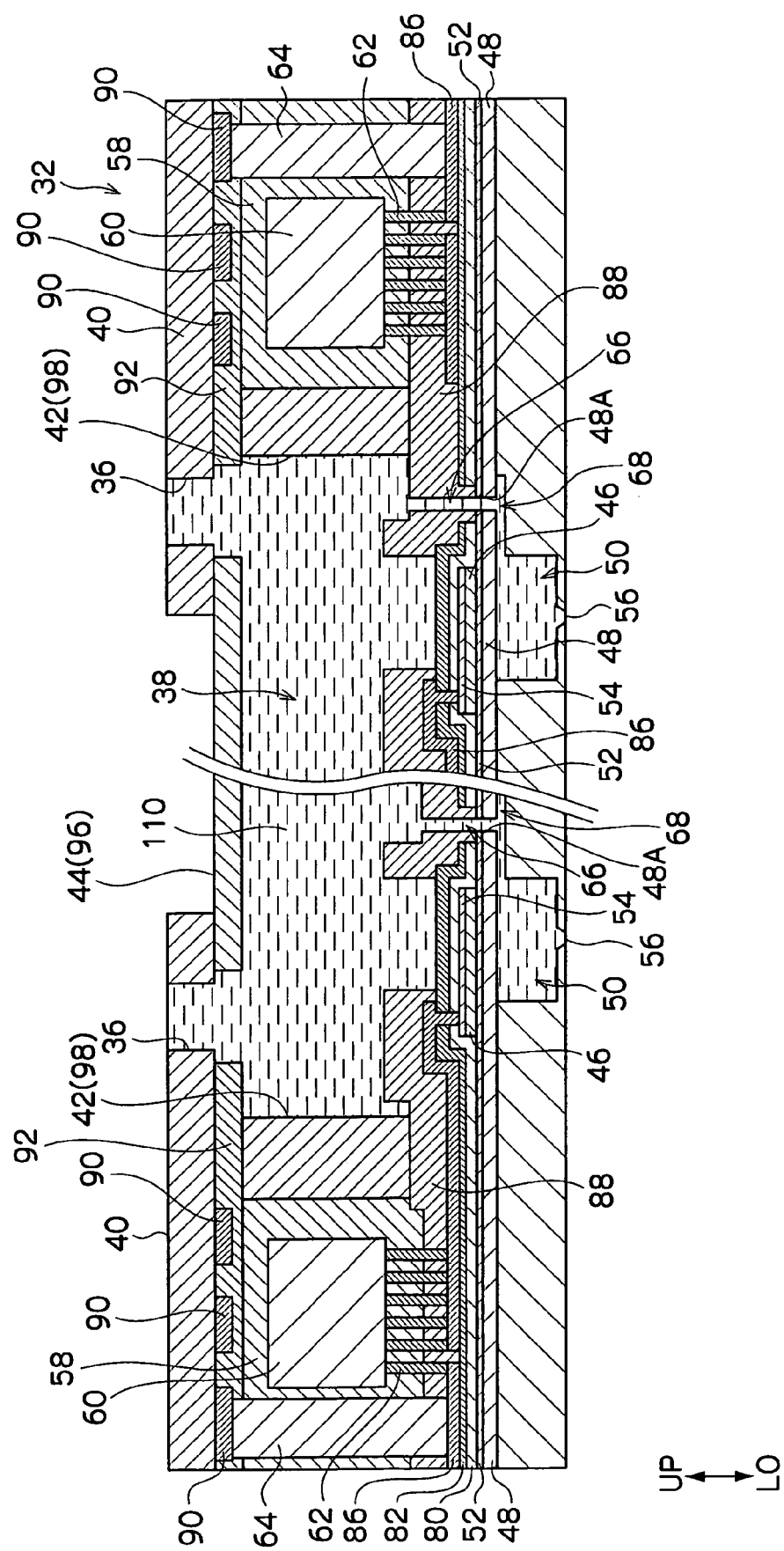
FIG. 4 is a schematic sectional view taken along line X-X of FIG. 3.

Next, the inkjet recording head 32 in the inkjet recording device 10 having the above-described structure will be described in detail. FIG. 3 is a schematic plan view showing the structure of the inkjet recording head 32, and FIG. 4 is a schematic sectional view taken along line X-X of FIG. 3. As shown in FIGS. 3 and 4, ink supplying ports 36, which communicate with the ink tank 34, are provided at the inkjet recording head 32. Ink 110, which is injected-in from these ink supplying ports 36, is pooled in an ink pooling chamber 38.

The volume of the ink pooling chamber 38 is regulated by a top plate 40 and a partitioning wall 42. Plural the ink supplying ports 36 are formed in lines at predetermined places of the top plate 40. Further, an air damper 44 (a photosensitive dry film 96 which will be described later), which is made of resin and mitigates pressure waves, is provided in the ink pooling chamber 38, further toward the inner side than the top plate 40 and between the ink supplying ports 36 which form the lines.

Any material, such as glass, ceramic, silicon, resin, or the like for example, may be used as the material of the top plate 40, provided that it is an insulator which has a strength such that it can become the supporting body of the inkjet recording head 32. Further, metal wires 90, which are for energizing driving ICs 60 which will be described later, are provided at the top plate 40. The metal wires 90 are covered and protected by a resin film 92, such that erosion of the metal wires 90 due to the ink 110 is prevented.

The partitioning wall 42 is molded of resin (a photosensitive dry film 98 which will be described later), and partitions the ink pooling chamber 38 into a rectangular shape. Further, the ink pooling chamber 38 above is separated from pressure chambers 50 below, via piezoelectric elements 46 and a vibrating plate 48 which is flexurally deformed in the top-bottom direction by the piezoelectric elements 46. Namely, the piezoelectric elements 46 and the vibrating plate 48 are structured so as to be disposed between the ink pooling chamber 38 and the pressure chambers 50, and the ink pooling chamber 38 and the pressure chambers 50 are structured so as to not exist on the same horizontal plane.

Accordingly, the pressure chambers 50 can be disposed in states of being near to one another, and the nozzles 56 can be disposed in the form of a matrix and at a high density. Due to such a structure, an image can be formed in a wide band region due to the carriage 12 moving one time in the main scanning direction. Therefore, the scanning time can be made to be short. Namely, it is possible to realize high-speed printing in which an image is formed over the entire surface of the recording sheet P in a short time and by a small number of times of movement of the carriage 12.

The piezoelectric element 46 is adhered onto the top surface of the vibrating plate 48 for each pressure chamber 50. The vibrating plate 48 is molded of a metal such as SUS or the like, and is elastic at least in the top-bottom direction. When the piezoelectric element 46 is energized (i.e., when voltage is applied to the piezoelectric element 46), the vibrating plate 48 flexurally deforms (is displaced) in the top-bottom direction. Note that the vibrating plate 48 may be an insulating material such as glass or the like.

A lower electrode 52, which is one polarity and which also functions as a wire (a first wire), is disposed at the bottom surfaces of the piezoelectric elements 46. Upper electrodes 54, which are the other polarity, are disposed on the top surfaces of the piezoelectric elements 46. The driving ICs 60 are electrically connected to the upper electrodes 54 by metal wires 86 (second wires).

The piezoelectric elements 46 (including the upper electrodes 54) are covered and protected by a low water permeable insulating film 80 (an $SiO_x$ film is used in the present embodiment). The low water permeable insulating film 80, which covers and protects the piezoelectric elements 46, is formed such that the moisture permeability thereof is low. Therefore, the low water permeable insulating film 80 can prevent poor moisture resistance due to moisture penetrating into the piezoelectric elements 46 (i.e., a deterioration in the piezoelectric characteristic caused by reduction of the oxygen within the PZT film) from occurring.

Note that the vibrating plate 48, which is formed of metal (SUS or the like) and contacts the lower electrode 52, also functions as a low-resistance GND wire.

The density of the dangling bonds (of the structural atoms) at the low water permeable insulating film 80 is greater than or equal to $1 \times 10^{18}$ $cm^{-3}$ (and preferably $5 \times 10^{18}$ to $5 \times 10^{19}$ $cm^{-3}$). Due to the dangling bonds, the low water permeable insulating film 80 traps moisture and realizes low water permeability. The density of the dangling bonds can be determined by Electron Spin Resonance (ESR) measurement.

In this way, because the dangling bond density at the low water permeable insulating film 80 is sufficiently high, (a total number of) dangling bonds needed in order to sufficiently impart moisture-resistance can be obtained, even if the film thickness of the low water permeable insulating film 80 is as thin as, for example, 0.1 µm. Therefore, there are few mechanical constraints on the piezoelectric elements due to the low water permeable insulating film 80, and impeding of the displacement of the piezoelectric elements is prevented well.

Moreover, at the piezoelectric elements 46, the top surface of the low water permeable insulating film 80 is covered and protected by a resin insulating film 82. In this way, the resistance to erosion by the ink 110 is ensured at the piezoelectric elements 46. The low water permeable insulating film 80 and the resin insulating film 82 cover and protect the piezoelectric elements 46, and also cover and protect the lower electrode 52 (the first wire) at the regions where the piezoelectric elements 46 are not provided, functioning as an interlayer insulating film.

The metal wires 86 (second wires) are covered and protected by a resin protective film 88 (another, i.e., a second, resin insulating film). This resin protective film 88 also functions as a protective film for these wires, and prevents erosion due to the ink 110.

The regions above the piezoelectric elements 46 are covered and protected by the resin insulating film 82, and are not covered by the resin protective film 88. Because the resin insulating film 82 is a flexible resin layer, due to such a structure, impeding of displacement of the piezoelectric elements 46 (the vibrating plate 48) is prevented (the piezoelectric elements 46 (the vibrating plate 48) can flexurally deform appropriately in the top-bottom direction). Namely, at the resin layer above the piezoelectric element 46, the thinner the layer, the better the effect of suppressing the impeding of displacement. Therefore, the resin protective film 88 is not covered above the piezoelectric elements 46.

The driving ICs 60 are disposed at the outer sides of the ink pool chamber 38 which is defined by the partitioning wall 42, and between the top plate 40 and the vibrating plate 48. The driving ICs 60 are structured so as to not be exposed (not project out) from the vibrating plate 48 or the top plate 40. Accordingly, the inkjet recording head 32 can be made more compact.

Figure 5:
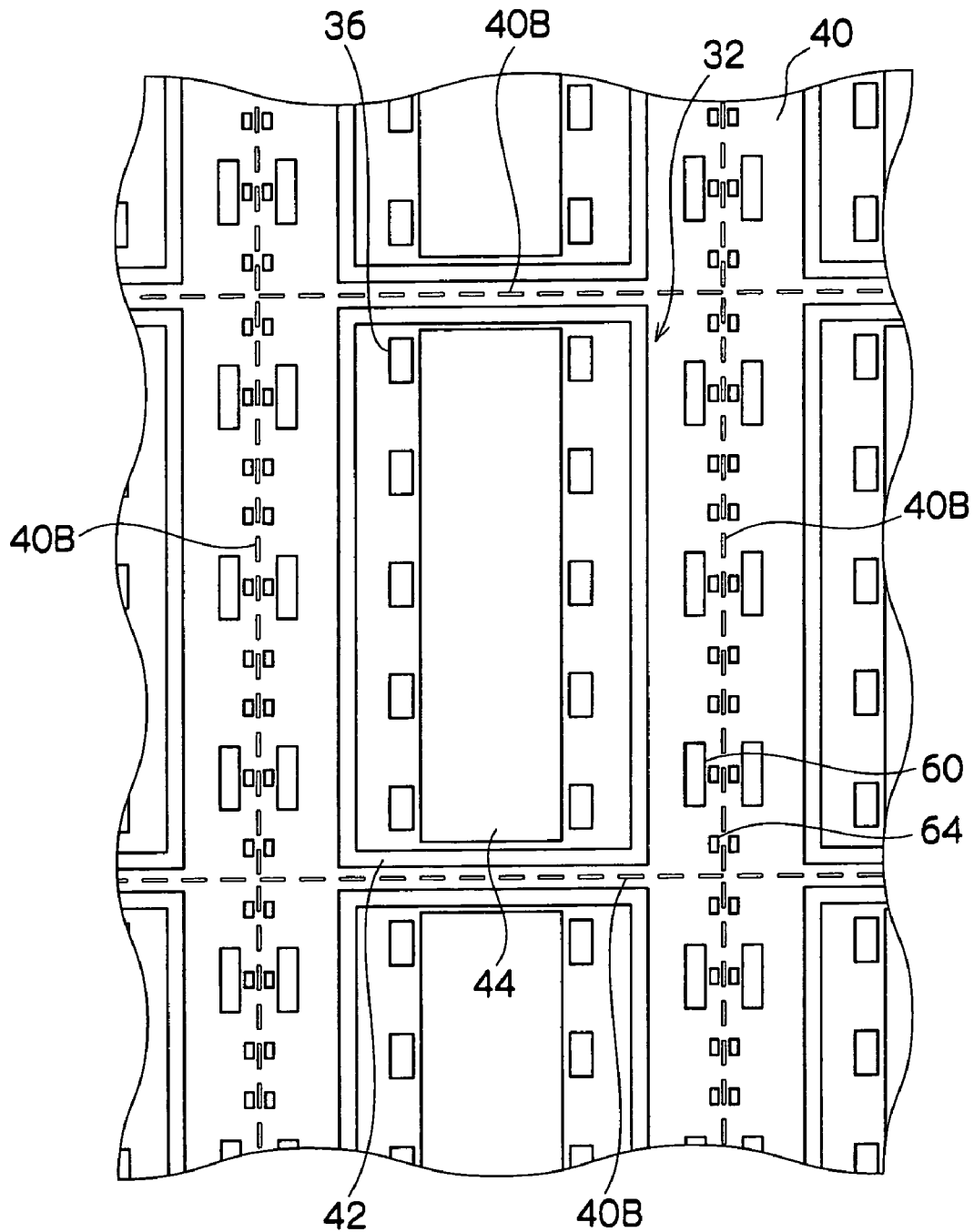
FIG. 5 is a schematic plan view showing a top plate before being cut as the inkjet recording heads.

The peripheries of the driving ICs 60 are sealed by a resin material 58. As shown in FIG. 5, plural injection openings 40B of the resin material 58 which seals the driving ICs 60 are formed in the top plate 40 in the manufacturing step, in a grid-like form so as to partition the respective inkjet recording heads 32. After the coupling (joining) of a piezoelectric element substrate 70 and a flow path substrate 72 which will be described later, the top plate 40 is cut along the injection openings 40B which are sealed (closed) by the resin material 58. In this way, plural the inkjet recording heads 32, which each have the nozzles 56 (see FIG. 3) in a matrix form, are manufactured at one time.

Figure 6:
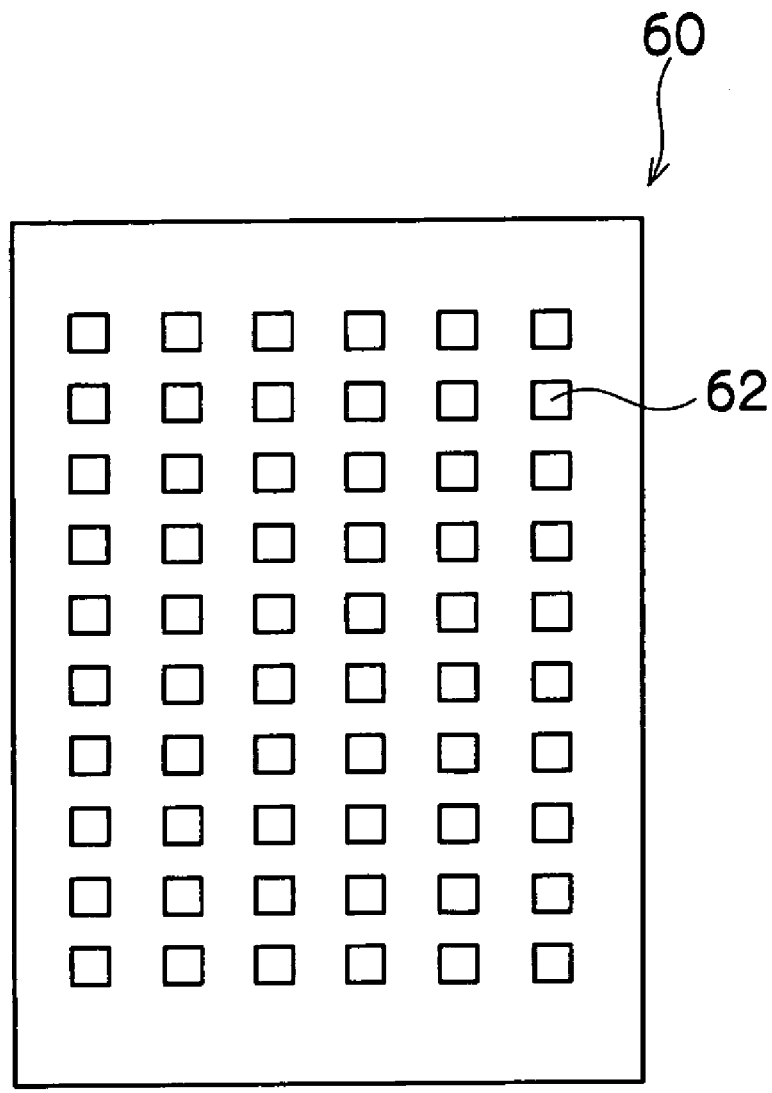
FIG. 6 is a schematic plan view showing bumps of a driving IC.

As shown in FIGS. 4 and 6, plural of bumps 62 project out by predetermined heights and in the form of a matrix at the bottom surface of the driving IC 60, so as to be flip-chip packaged at the metal wires 86 of the piezoelectric element substrate 70 at which the piezoelectric elements 46 are formed on the vibrating plate 48. Accordingly, high-density connection to the piezoelectric elements 46 can be realized easily, and a reduction in the height of the driving IC 60 is possible (the driving IC 60 can be made thinner). For this reason as well, the inkjet recording head 32 can be made more compact.

Bumps 64 are provided at the outer sides of the driving ICs 60 in FIG. 3. The bumps 64 connect metal wires 90 provided at the top plate 40, and the metal wires 86 provided at the piezoelectric element substrate 70. The bumps 64 are of course provided so as to be higher than the heights of the driving ICs 60 packaged on the piezoelectric element substrate 70.

Accordingly, the metal wires 90 of the top plate 40 are energized from the main body of the inkjet recording device 10, and the metal wires 86 are energized from the metal wires 90 of the top plate 40 via the bumps 64, and the driving ICs 60 are energized therefrom. Voltage is applied to the piezoelectric elements 46 at predetermined times by the driving ICs 60, such that the vibrating plate 48 is flexurally deformed in the top-bottom direction. The ink 110 filled in the pressure chambers 50 is thereby pressurized, such that ink drops are ejected from the nozzles 56.

One nozzle 56 which ejects the ink drops is provided for each pressure chamber 50, at a predetermined position thereof. The pressure chamber 50 and the ink pooling chamber 38 are connected by an ink flow path 66 and an ink flow path 68 communicating with one another. The ink flow path 66 bypasses the piezoelectric element 46 and passes through a through-hole 48A formed in the vibrating plate 48. The ink flow path 68 extends horizontally in FIG. 4 from the pressure chamber 50.

The ink flow path 68 is formed so as to be a little longer than the portion which is actually to be connected to the ink flow path 66, such that the ink flow path 68 can be aligned with the ink flow path 66 (such that they can reliably be made to communicate with one another) at the time of manufacturing the inkjet recording head 32.

Next, the manufacturing processes of the inkjet recording head 32, which is structured as described above, will be described in detail on the basis of FIG. 7 through FIGS. 13A and 13B. As shown in FIG. 7, the inkjet recording head 32 is manufactured by forming the piezoelectric element substrate 70 and the flow path substrate 72 separately, and coupling (joining) the two together. Thus, the process of manufacturing the piezoelectric element substrate 70 will be described first. The top plate 40 is united (joined) to the piezoelectric element substrate 70 before the flow path substrate 72.

As shown in FIG. 8A, first, a first supporting substrate 76, which is formed of glass and in which plural through-holes 76A are formed, is readied. The first supporting substrate 76 may be any material provided that it does not flex, and is not limited to being formed of glass. Glass is preferable as it is hard and inexpensive. Femtosecond pulse laser machining of a glass substrate, exposure and development of a photosensitive glass substrate (e.g., PEG3C manufactured by Hoya Corporation), and the like are known as methods for producing the first supporting substrate 76.

Then, as shown in FIG. 8B, an adhesive 78 is applied to the top surface (the obverse) of the first supporting substrate 76, and, as shown in FIG. 8C, the vibrating plate 48 which is formed of metal (SUS or the like) is adhered on the top surface. At this time, the through-holes 48A of the vibrating plate 48 and the through-holes 76A of the first supporting substrate 76 are not superposed (do not overlap). Note that an insulating substrate of glass or the like may be used as the material of the vibrating plate 48.

Here, the through-holes 48A of the vibrating plate 48 are for forming the ink paths 66. The reasons why the through-holes 76A are provided in the first supporting substrate 76 are in order to allow a chemical liquid (solvent) to flow-in to the interface between the first supporting substrate 76 and the vibrating plate 48 in a later step, and in order to dissolve the adhesive 78 and peel the first supporting substrate 76 from the vibrating plate 48. Further, the reason why the through-holes 76A of the first supporting substrate 76 and the through-holes 48A of the vibrating plate 48 are made to not overlap is in order for the respective materials which are used in manufacturing to not leak out from the bottom surface (the reverse surface) of the first supporting substrate 76.

Next, as shown in FIG. 8D, the lower electrode 52, which is layered on the top surface of the vibrating plate 48, is patterned. Specifically, metal film sputtering (film thickness: 500 Å to 3000 Å), resist formation by photolithography, patterning (etching), and resist removal by oxygen plasma are carried out. This lower electrode 42 is a ground potential.

Next, in step 8E, a PZT film, which is the material of the piezoelectric elements 46, and the upper electrodes 54 are layered in that order by sputtering on the top surface of the lower electrode 52. As shown in FIG. 8F, the piezoelectric elements 46 (the PZT film) and the upper electrodes 54 are patterned.

Specifically, PZT film sputtering (film thickness: 3 μm to 15 μm), metal film sputtering (film thickness: 500 Å to 3000 Å), resist formation by photolithography, patterning (etching), and resist removal by oxygen plasma are carried out. Examples of the material for the lower and upper electrodes include Au, Ir, Ru, Pt, and the like, which are heat-resistant and have good affinity with the PZT material which is the piezoelectric elements.

Thereafter, as shown in FIG. 8G, the low water permeable insulating film (a silicon oxide film: $SiO_x$ film) 80 is layered on the top surfaces of the lower electrode 52 and the upper electrodes 54 which are exposed at the top surface. Then, the resin insulating film 82 which is ink-resistant and flexible, e.g., a resin film of a polyimide, a polyamide, an epoxy, a polyurethane, a silicone, or the like, is layered on the top surface of the low water permeable insulating film (a silicon oxide film: $SiO_x$ film) 80. By patterning these, openings 84 (contact holes) for connecting the piezoelectric elements 46 and the metal wires 86 are formed.

Specifically, the following processes are carried out: the low water permeable insulating film ($SiO_x$ film) 80 which has a high dangling bond density is formed by Chemical Vapor Deposition (CVD); a photosensitive polyimide (e.g., photosensitive polyimide Durimide 7520 manufactured by FUJIFILM Electronics Materials Co., Ltd.) is coated, exposed, and developed so as to be patterned; and the $SiO_x$ film is etched by using the photosensitive polyimide as a mask, by Reactive Ion Etching (RIE) using $CF_4$ gas. Note that the silicon oxide film ($SiO_x$ film) used as the low water permeable insulating film here may be a silicon nitride film ($SiN_x$ film), a silicon oxynitride film ($SiO_xN_y$ film), or the like.

Here, in order to satisfy the aforementioned range of the dangling bond density, it is preferable to form the low water permeable insulating film 80 by ECR (Electron Cyclotron Resonance) because the proportion of dangling bonds in the film which react with other impurity atoms (hydrogen) and are extinguished is then low due to film formation at a low temperature being possible.

According to the ECR method, the low water permeable insulating film 80 which satisfies the aforementioned range of the dangling bond density can be formed under more easily settable conditions than an RF (Radio Frequency) method, e.g., by employing a Chemical Vapor Deposition (CVD) method performed at $O_2/SiH_4$ ratio=1.2, microwave power=300 W, formation temperature=100° C., gas pressure=0.13 Pa.

However, it is also possible to form the low water permeable insulating film 80 which satisfies the aforementioned range of the dangling bond density by the RF (Radio Frequency) method, depending on film forming conditions (e.g., in a CVD method, the conditions of $N_2O/SiH_4$ ratio=10, RF power=120 W, formation temperature=300° C., gas pressure=130 Pa).

Note that the low water permeable insulating film 80 which is formed by the ECR method is more advantageous than that formed by RF for the following reason: as described above, because the dangling bond density is high, a relatively thin film thickness suffices for obtaining the needed (total number on dangling bonds (e.g., a film thickness which is ⅕ as compared with the RF method is enough); and the mechanical constraining force on the piezoelectric elements 46 is reduced.

Here, the CVD method is used as an example, but film formation by sputtering is possible. Film formation is carried out by using plasma discharge of a mixed gas of Ar and $O_2$, by using Si at the target. Further, a mixed gas of Ar and $N_2$ may be used in order to form a $SiN_x$ film by sputtering. Other films as well, e.g., $AlO_x$ film, $AlN_x$ film, $TaO_x$ film, $TaN_x$ film, and the like, may be formed by appropriately selecting the target material and the gas.

As compared with CVD, sputtering is inferior in that the produceability is low. However, with the sputtering method, because hydrogen (H) is not contained in the raw materials (the target and the gas), a deterioration in the performance of the piezoelectric elements (the piezoelectric property) brought about by reduction caused by hydrogen can be prevented.

In both CVD and sputtering, moisture penetrating-in from the exterior is blocked. Therefore, the method may be selected in accordance with the feature (produceability or performance) to which importance is attached.

Next, as shown in FIG. 8H, a metal film is layered on the top surfaces of the resin insulating film 82 and the upper electrodes 54 within the openings 84, and the metal wires 86 are patterned. Specifically, the following processes are carried out: an Al film (thickness: 1 μm) is formed by sputtering; a resist is formed by photolithography; the Al film is etched by RIE using a chlorine gas; and the resist film is removed by oxygen plasma. The upper electrodes 54 and the metal wires 86 (the Al film) are then joined.

Note that, although not illustrated, the openings 84 are provided above the lower electrode 52 as well, such that the lower electrode 52 is connected to the metal wires 86, in the same way as with the upper electrodes 54.

Then, as shown in FIG. 8I, the resin protective film 88 (e.g., the photosensitive polyimide Durimide 7320 manufactured by FUJIFILM Electronics Materials Co., Ltd.) is layered on the top surfaces of the metal wires 86 and the resin insulating film 82, and is patterned. This resin protective film 88 is formed of the same type of resin material as the resin insulating film 82.

At this time, the resin protective film 88 is not layered on the regions above the piezoelectric elements 46 where the metal wires 86 are not patterned (only the resin insulating film 82 is layered thereat).

The reason why the resin protective film 88 is not layered above the piezoelectric elements 46 (on the top surface of the resin insulating film 82) is in order to prevent the displacement (flexural deformation in the top-bottom direction) of the vibrating plate 48 (the piezoelectric elements 46) from being impeded.

When the metal wires 86, which are pulled out from the upper electrodes 54 of the piezoelectric elements 46 (i.e., connected to the upper electrodes 54), are covered by the resin protective film 88, because the resin protective film 88 is formed of the same type of resin material as the resin insulating film 82 on which the metal wires 86 are layered, the joining forces thereof which cover the metal wires 86 are strong, and corrosion of the metal wires 86 due to the ink 110 penetrating-in from the boundary surface can be prevented.

Because the resin protective film 88 is formed of the same type of resin material as the resin insulating film 82, the joining force of the resin protective film 88 with respect to the resin insulating film 82 as the lower layer is strong. Further, because the resin protective film 88 is formed of the same type of resin material as the partitioning wall 42 (the photosensitive dry film 98) as well, the joining force of the resin protective film 88 with respect to the partitioning wall 42 (the photosensitive dry film 98) also is strong. Accordingly, the penetrating-in of ink 110 from the respective boundary surfaces is prevented even more, and leaking of ink and erosion of the metal wires 86 are reliably prevented.

Further, using the same type of resin material in this way is advantageous in that the coefficients of thermal expansion thereof are substantially equivalent and therefore there is little generation of thermal stress.

Next, as shown in FIG. 8J, the driving ICs 60 are flip-chip packaged on the metal wires 86 via the bumps 62. At this time, the driving ICs 60 are worked to a predetermined thickness (70 μm to 300 μm) in a grinding process carried out in advance at the end of the semiconductor wafer processes. If the driving ICs 60 are too thick, patterning of the partitioning wall 42 and formation of the bumps 64 are difficult.

Electroplating, electroless plating, ball bumps, screen printing, or the like can be used as the method for forming the bumps 62 for flip-chip packaging the driving ICs 60 on the metal wires 86. In this way, the piezoelectric element substrate 70 is produced, and the top plate 40, which is made of glass for example, is united (joined) thereto. Note that, for convenience of explanation, in FIGS. 9A through 9H to be described hereinafter, description is given with the wire formation surface being the bottom surface (in the actual processes, the wire formation surface is the top surface).

Figure 9A:
FIGS. 9A through 9H are diagrams explaining steps (A) through (H) of manufacturing the top plate.

In manufacturing the glass top plate 40, as shown in FIG. 9A, the top plate 40 itself has a thickness (0.3 mm to 1.5 mm) which can ensure strength needed for the top plate 40 to be a supporting body. Therefore, there is no need to provide a separate supporting body.

Figure 9B:
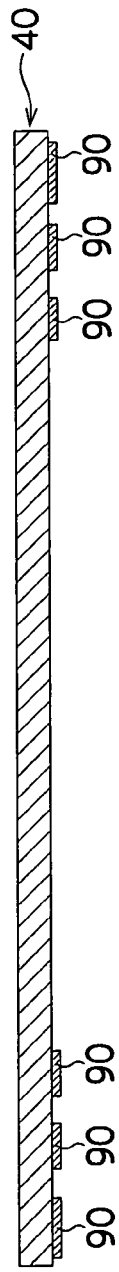

First, as shown in FIG. 9B, the metal wires 90 are layered on the bottom surface of the top plate 40, and patterning is carried out. Specifically, the following processes are carried out: an Al film (thickness: 1 μm) is formed by a sputtering method, a resist is formed by photolithography, the Al film is etched by RIE using a chlorine gas, and the resist film is removed by oxygen plasma.

Figure 9C:
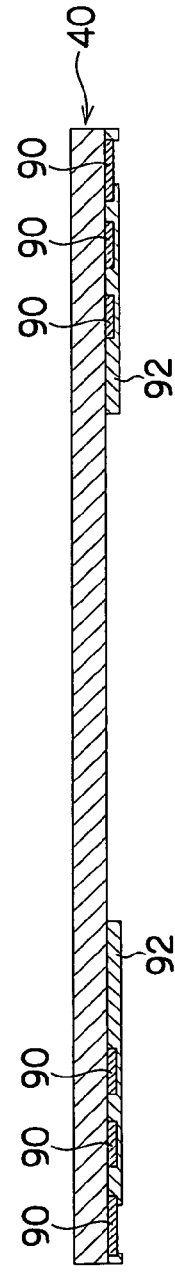

Then, as shown in FIG. 9C, the resin film 92 (e.g., photosensitive polyimide Durimide 7320 manufactured by FUJIFILM Electronics Materials Co., Ltd.) is layered on the surface at which the metal wires 90 are formed, and patterning is carried out. Note that, at this time, the resin film 92 is not layered on some of the metal wires 90 in order to join the bumps 64.

Figure 9D:
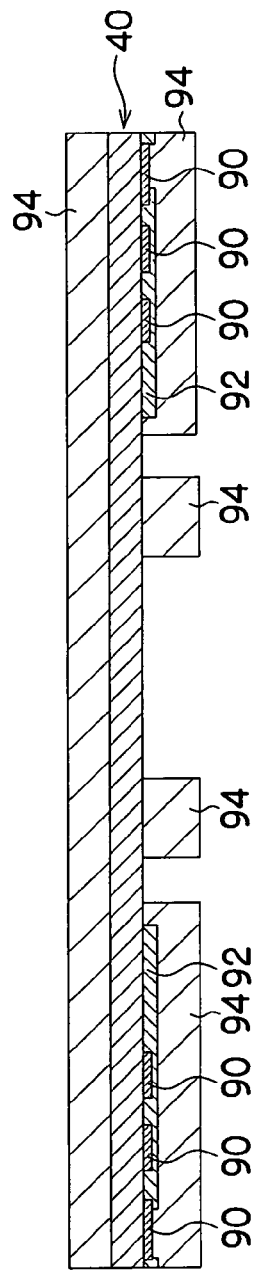

Next, as shown in FIG. 9D, a resist provided on the surface of the top plate 40 where the metal wires 90 are formed is subjected to patterning by photolithography. The surface of the top plate 40 where the metal wires 90 are not formed is entirely covered by a resist 94 for protection. Here, the resist 94 for protection is coated in order to prevent etching, from the reverse surface, of the surface of the top plate 40 where the metal wires 90 are formed, in the subsequent wet ($SiO_2$) etching step.

Note that, in a case in which a photosensitive glass is used as the top plate 40, this step of applying the resist 94 for protection can be omitted.

Figures 9E, 9F, 9G, 9H:
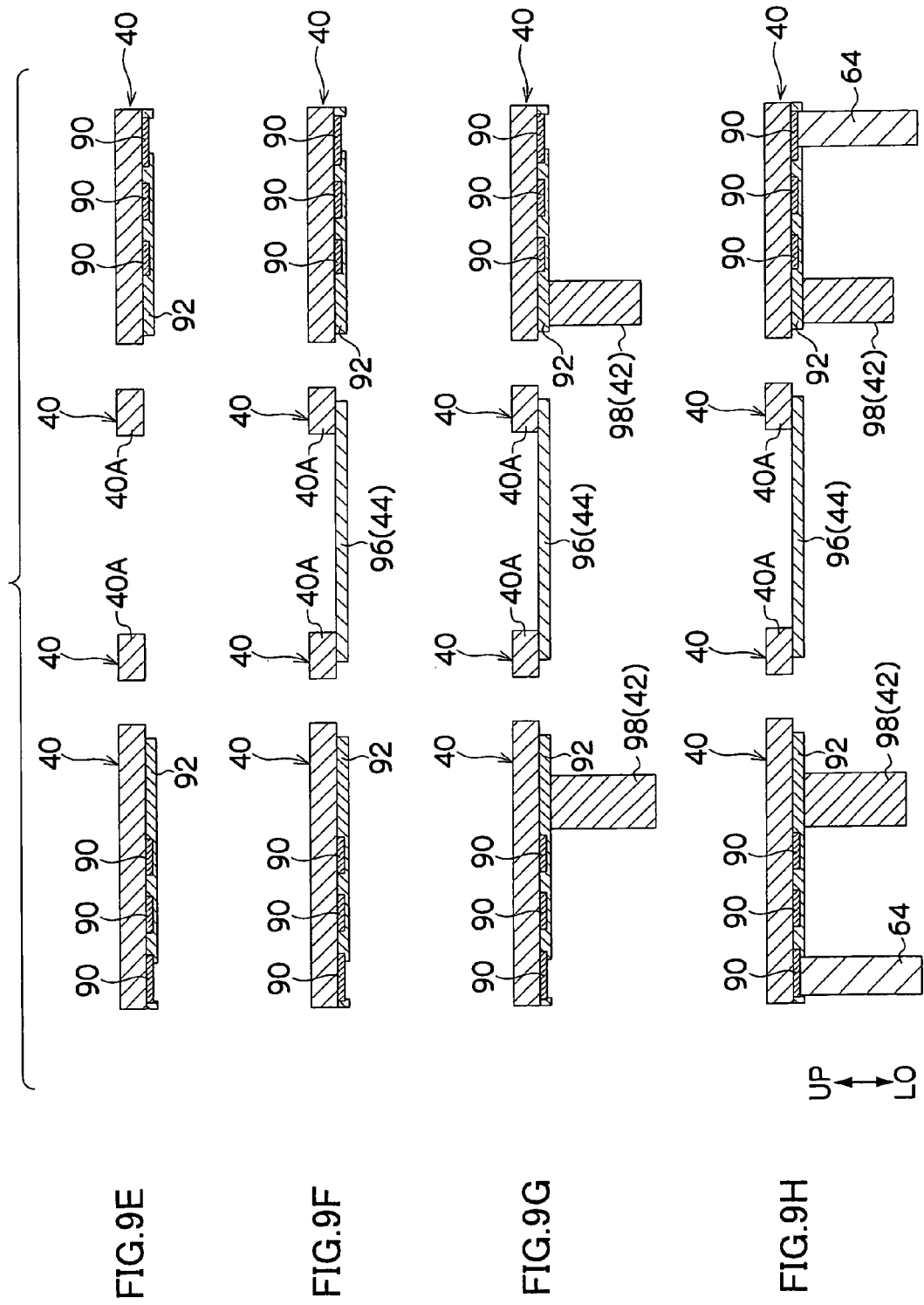

Next, as shown in FIG. 9E, wet ($SiO_2$) etching by an HF solution is carried out on the top plate 40, and thereafter, the resist 94 for protection is removed by oxygen plasma. Then, as shown in FIG. 9F, at the portions of the openings 40A formed in the top plate 40, the photosensitive dry film 96 (e.g., Raytec FR-5025 manufactured by Hitachi Chemical Co., Ltd., thickness: 25 μm) is provided in a patterned configuration (so as to bridge the portions of the openings 40A) by exposure and development. This photosensitive dry film 96 becomes the air damper 44 which mitigates pressure waves.

Subsequently, as shown in FIG. 9G, the photosensitive dry film 98 (thickness: 100 μm) is layered on the resin film 92, and is subjected to patterning by exposure and development. This photosensitive dry film 98 becomes the partitioning wall 42 which defines the ink pooling chamber 38. Note that the partitioning wall 42 is not limited to the photosensitive dry film 98, and may be a resin coated film (e.g., SU-8 resist manufactured by Kayaku Microchem KK). At this time, it suffices for coating to be carried out by a spray coating device, and for exposure and development to be carried out.

Then, finally, as shown in FIG. 9H, the bumps 64 are formed by plating or the like on the metal wires 90 on which the resin film 92 is not layered. In order to electrically connect these bumps 64 to the metal wires 86 of the ICs 60, as illustrated, the heights of the bumps 64 are formed to be higher than that of the photosensitive dry film 98 (the partitioning wall 42).

After the top plate 40 is manufactured in this way, as shown in FIG. 10A, the top plate 40 is placed on the piezoelectric element substrate 70, and the both are united (joined) together by thermocompression bonding. Namely, the photosensitive dry film 98 (the partitioning wall 42) is joined to the resin protective film 88 which is a photosensitive resin layer, and the bumps 64 are joined to the metal wires 86.

At this time, the heights of the bumps 64 are higher than the height of the photosensitive dry film 98 (the partitioning wall 42). Therefore, by joining the photosensitive dry film 98 (the partitioning wall 42) to the resin protective film 88, the bumps 64 are automatically joined to the metal wires 86. Namely, because it is easy to adjust the heights of the solder bumps 64 (the solder bumps 64 are easily crushed), the connecting of the bumps 64 and the sealing of the ink pooling chamber 38 by the photosensitive dry film 98 (the partitioning wall 42) can be carried out easily.

When the joining of the partitioning wall 42 and the bumps 64 is completed, as shown in FIG. 10B, the resin material 58 for sealing (e.g., an epoxy resin) is injected-in at the driving ICs 60. Namely, the resin material 58 is made to flow-in from the injection openings 40B (see FIG. 5) which are formed in the top plate 40. When the resin material 58 is injected-in and the driving ICs 60 are sealed in this way, the driving ICs 60 can be protected from the external environment such as moisture or the like, and the bonding strength of the piezoelectric element substrate 70 and the top plate 40 can be improved. Further, it is possible to avoid damage in the later steps, e.g., damage due to water or ground pieces at the time when the finished piezoelectric element substrate 70 is divided into the inkjet recording heads 32 by dicing.

Figure 10C:
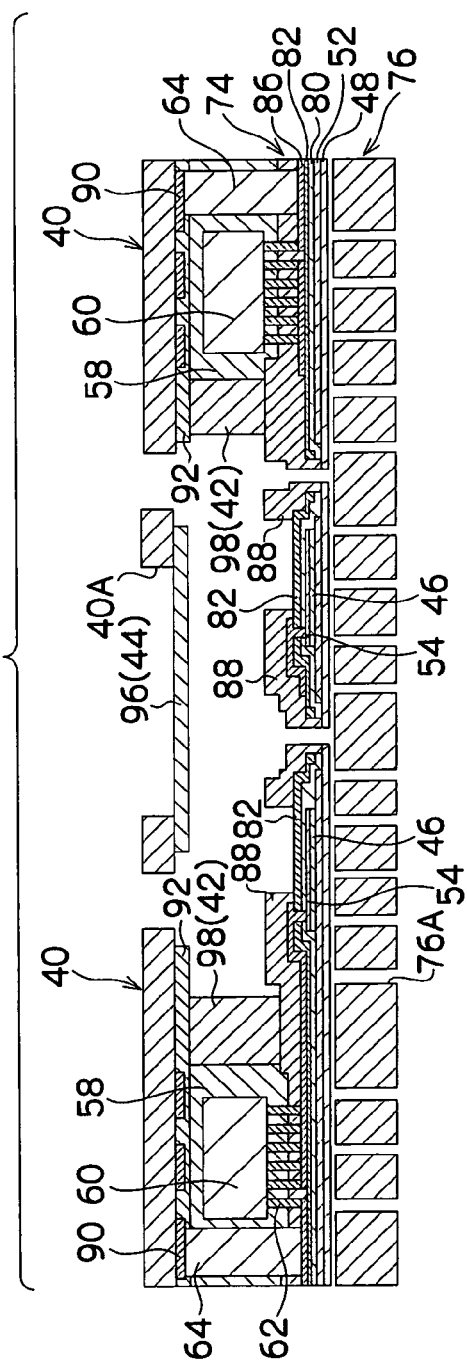
Figure 10D:
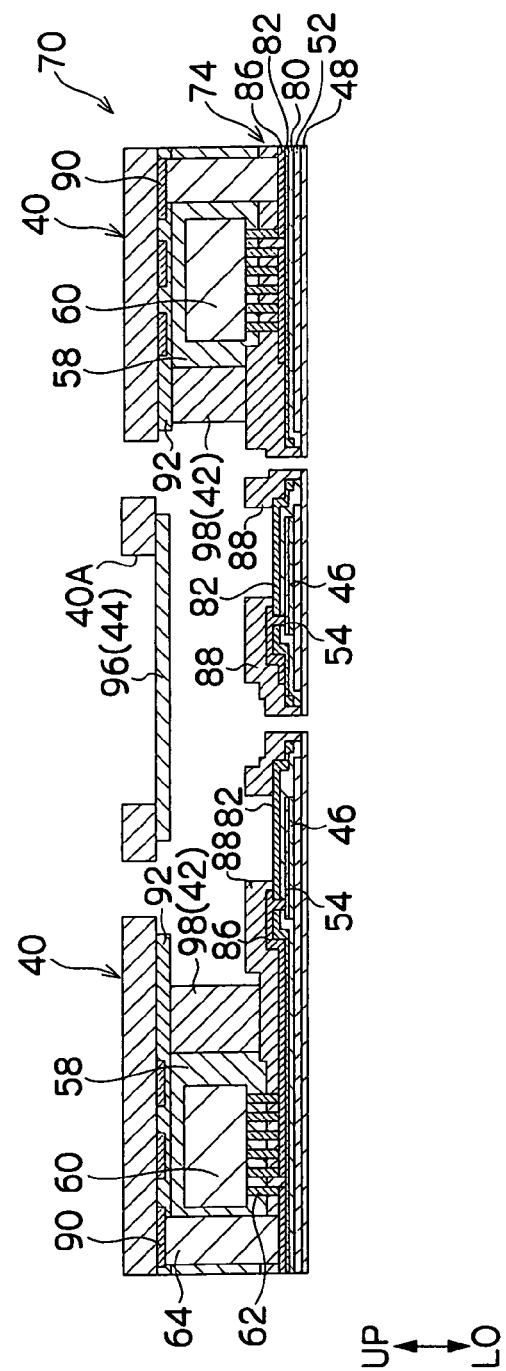

Next, as shown in FIG. 10C, by injecting-in a solution from the through-holes 76A of the first supporting substrate 76 and selectively dissolving the adhesive 78, the first supporting substrate 76 is separated from the piezoelectric element substrate 70. In this way, as shown in FIG. 10D, the piezoelectric element substrate 70, with which the top plate 40 is united (joined), is completed. Then, from this state, the top plate 40 becomes the supporting body of the piezoelectric element substrate 70.

On the other hand, as shown in FIG. 11A, for the flow path substrate 72, first, a second supporting substrate 100 which is formed of glass and in which plural through-holes 100A are formed, is readied. In the same way as the first supporting substrate 76, the second supporting substrate 100 may be any material provided that it does not flex, and is not limited to being formed of glass. Glass is preferable as it is hard and inexpensive. Femtosecond pulse laser machining of a glass substrate, exposure and development of a photosensitive glass substrate (e.g., PEG3C manufactured by Hoya Corporation), and the like are known as methods for producing the second supporting substrate 100.

Then, as shown in FIG. 11B, an adhesive 104 is coated on the top surface (the obverse) of the second supporting substrate 100. As shown in FIG. 11C, a resin substrate 102 (e.g., an amideimide substrate of a thickness of 0.1 mm to 0.5 mm) is adhered to the top surface (the obverse) thereof.

Then, as shown in FIG. 11D, the top surface of the resin substrate 102 is pushed against a mold 106, and heating and pressurizing processings are carried out. Thereafter, as shown in FIG. 11E, by releasing the mold 106 from the resin substrate 102, the flow path substrate 72, in which the pressure chambers 50 and the nozzles 56 and the like are formed, is completed.

When the flow path substrate 72 is completed in this way, as shown in FIG. 12A, the piezoelectric element substrate 70 and the flow path substrate 72 are united joined) by thermocompression bonding. Next, as shown in FIG. 12B, by injecting-in an adhesive peeling solution from the through-holes 100A of the second supporting substrate 100 and selectively dissolving the adhesive 104, the second supporting substrate 100 is separated from the flow path substrate 72.

Thereafter, as shown in FIG. 12C, the surface from which the second supporting substrate 100 has been separated is subjected to polishing processing using an abrasive whose main component is alumina, or to RIE processing using oxygen plasma. In this way, the surface layer is removed, and the nozzles 56 are opened. Then, as shown in FIG. 12D, by applying a fluorine material 108 (e.g., Cytop manufactured by Asahi Glass Co., Ltd.), which serves as a water repellant, onto the bottom surface where the nozzles 56 are open, the inkjet recording head 32 is completed. As shown in FIG. 12E, the ink 110 can be filled into the ink pooling chamber 38 and the pressure chambers 50.

Figure 13A:
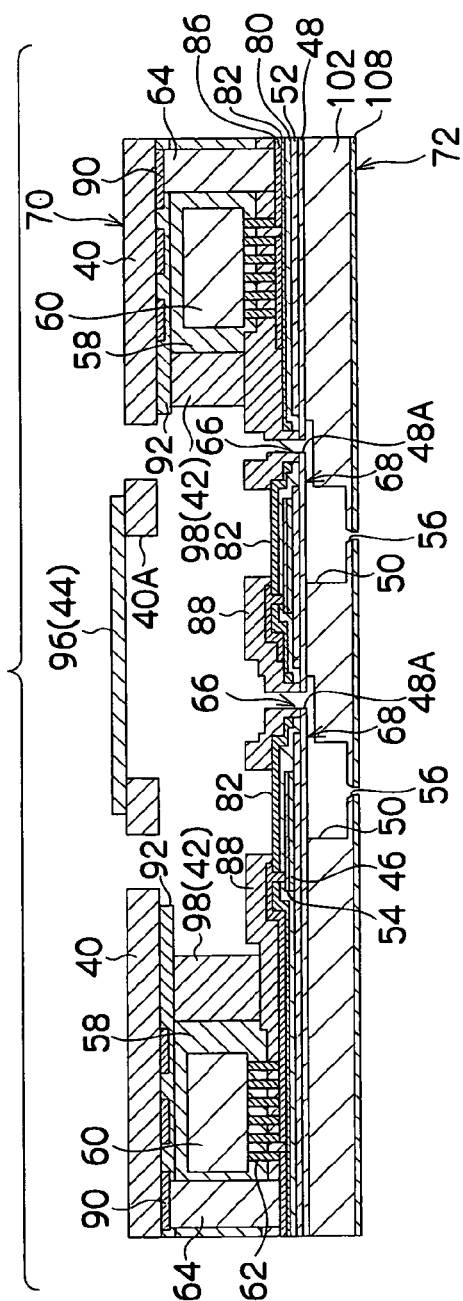
FIGS. 13A and 13B are diagrams explaining an inkjet recording head having a different air damper arrangement.
Figure 13B:
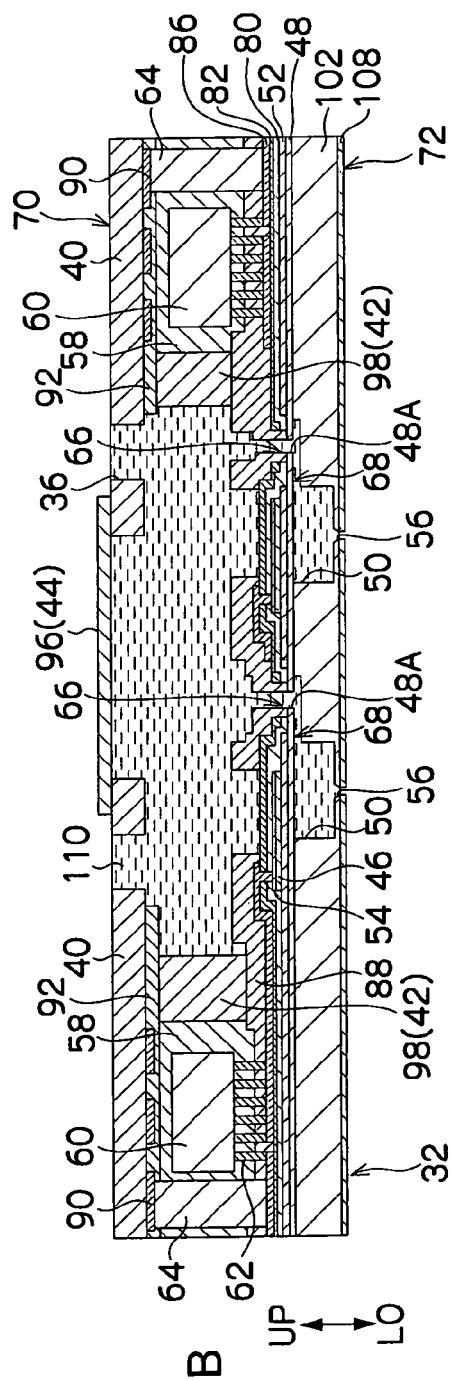
Figure 14:
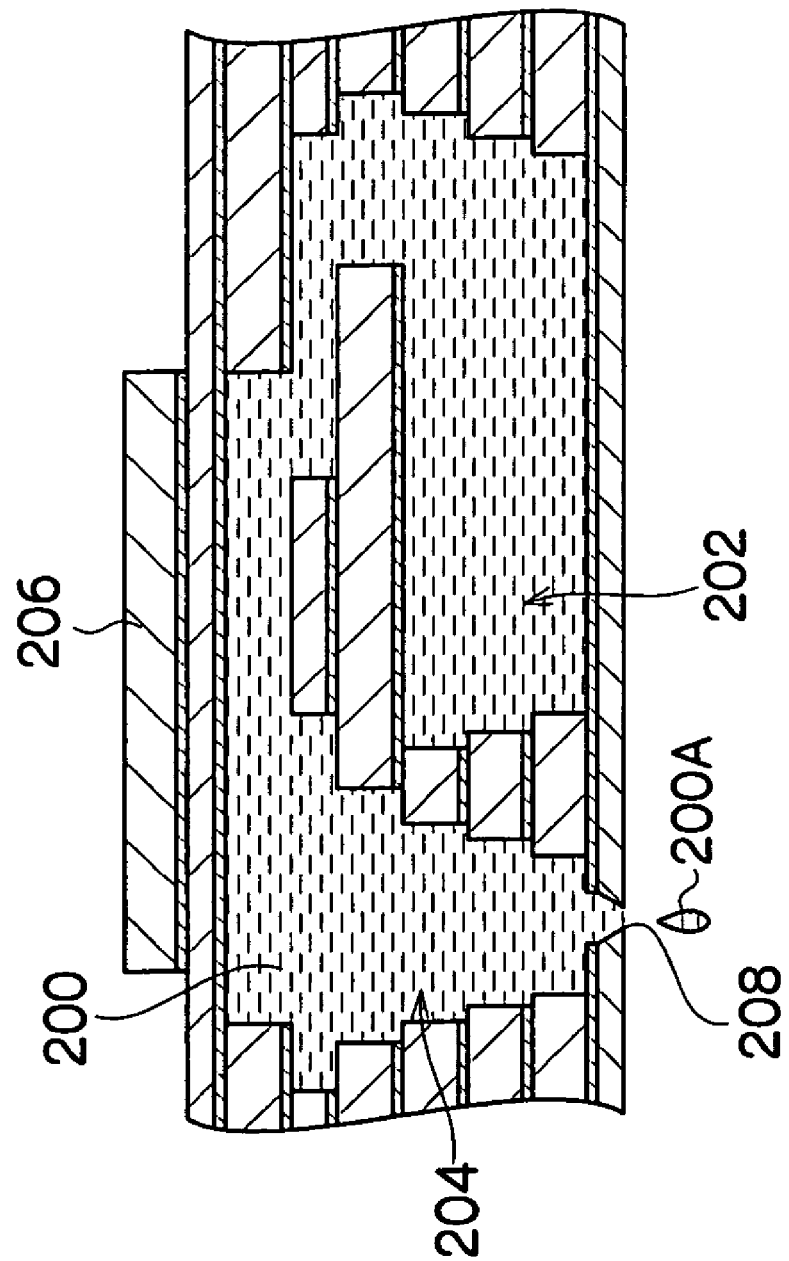
FIG. 14 is a schematic sectional view showing the structure of a conventional inkjet recording head.
Figure 15:
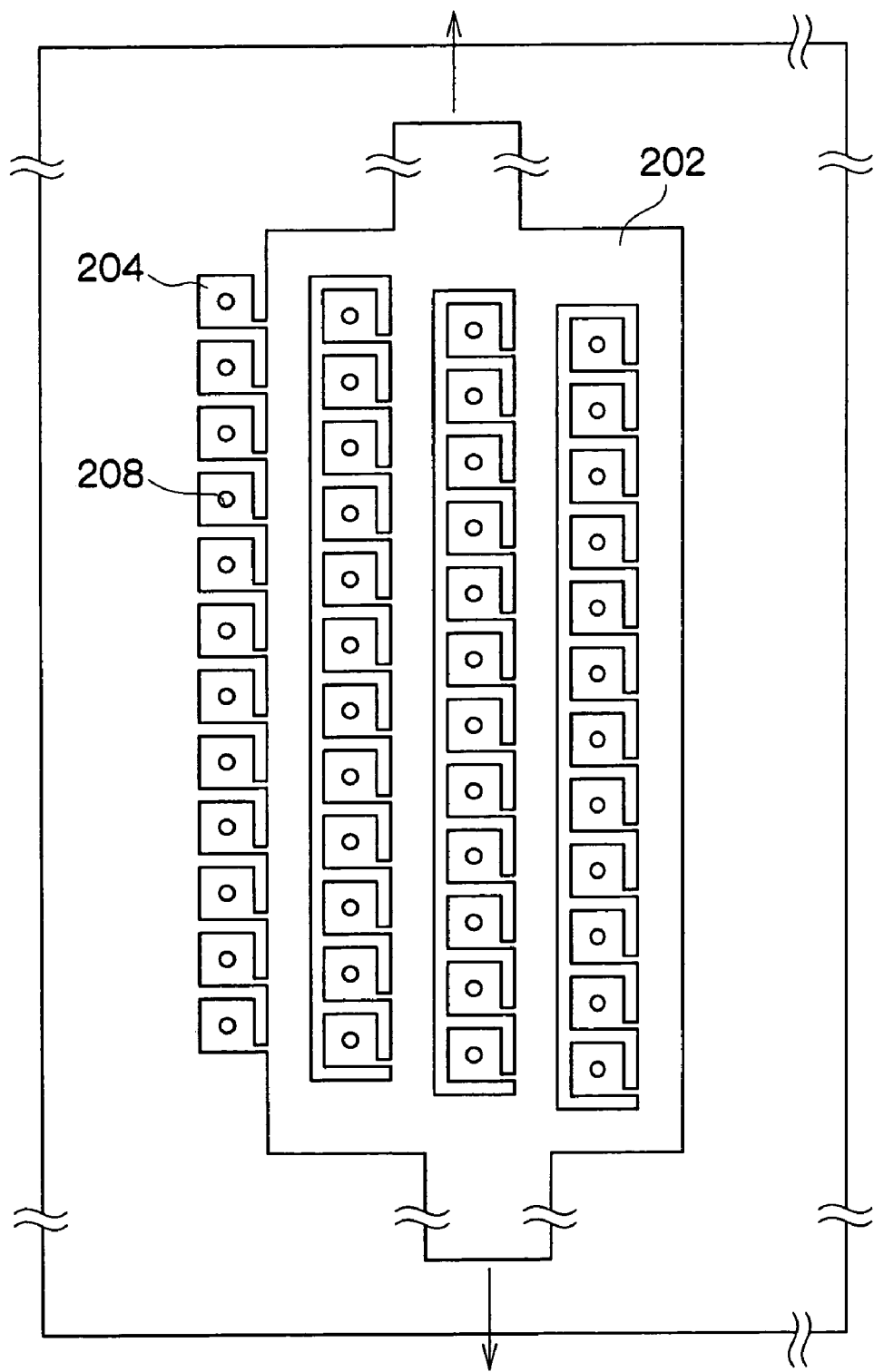
FIG. 15 is a schematic plan view showing the structure of the conventional inkjet recording head.

Note that the photosensitive dry film 96 (the air damper 44) is not limited to being provided within the ink pooling chamber 38 at the inner side of the top plate 40. For example, as shown in FIGS. 13A and 13B, the photosensitive dry film 96 (the air damper 44) may be provided at the outer side of the top plate 40. Namely, a structure may be used in which, immediately before the step of filling-in the ink 110, the photosensitive dry film 96 (the air damper 44) is affixed to the top plate 40 from the outer side of the ink pooling chamber 38.

Next, operation of the inkjet recording device 10, which is provided with the inkjet recording head 32 which is structured as described above, will be described. First, when an electric signal instructing printing is sent to the inkjet recording device 10, one of the recording sheets P is picked-up from the sheet feed tray 26, and is conveyed to a predetermined position by the subscanning mechanism 18.

On the other hand, at the inkjet recording unit 30, the ink 110 is injected-in (filled-in) in the ink pooling chamber 38 of the inkjet recording head 32 from the ink tank 34 and via the ink supplying ports 36. The ink 110 which is filled in the ink pooling chamber 38 is supplied to (filled into) the pressure chambers 50 via the ink flow paths 66, 68. At this time, a meniscus, in which the surface of the ink 110 is slightly concave toward the pressure chamber 50 side, is formed at the distal end (the ejecting opening) of the nozzle 56.

Then, while the inkjet recording heads 32, which are installed in the carriage 12, move in the main scanning direction, due to ink drops being selectively ejected from the plural nozzles 56, a portion of the image based on the image data is recorded in a predetermined band region of the recording sheet P. Specifically, voltage is applied to predetermined piezoelectric elements 46 at predetermined times by the driving ICs 60, the vibrating plate 48 is flexurally deformed in the top-bottom direction (is out-of-plane vibrated), pressure is applied to the ink 110 within the pressure chambers 50, and the ink 110 is ejected as ink drops from predetermined nozzles 56.

When a portion of the image based on the image data is recorded on the recording sheet P in this way, the recording sheet P is conveyed a predetermined pitch by the subscanning mechanism 18. In the same way as described above, due to ink drops being selectively ejected from the plural nozzles 56 again while the inkjet recording heads 32 move in the main scanning direction, a portion of the image based on the image data is recorded at the next band region of the recording sheet P.

When these operations are repeatedly carried out and the image based on the image data is completely recorded on the recording sheet P, the subscanning mechanism 18 conveys the recording sheet P to the end and discharges the recording sheet P onto the sheet discharge tray 28. In this way, printing processing (image recording) onto the recording sheet P is completed.

Here, at the inkjet recording head 32, the ink pooling chamber 38 is provided at the side opposite the pressure chambers 50 (the top side), with the vibrating plate 48 (the piezoelectric elements 46) therebetween. In other words, the vibrating plate 48 (the piezoelectric elements 46) is disposed between the ink pooling chamber 38 and the pressure chambers 50, and the ink pooling chamber 38 and the pressure chambers 50 do not exist on the same horizontal plane. Accordingly, the pressure chambers 50 are disposed near to one another, and the nozzles 56 are disposed at a high density.

The protective film, which is formed from the low water permeable insulating film 80 and the resin insulating film 82, is provided on the surfaces of the piezoelectric elements 46 (the surfaces at the ink pooling chamber 38 side). Therefore, as described above, moisture-resistance is imparted to the piezoelectric elements by the low water permeable insulating film serving as the lower layer of the protective film, ink-resistance is imparted to the piezoelectric elements by the resin insulating film serving as the upper layer of the protective film, both the ink-resistance and the moisture-resistance are improved simultaneously, and good reliability is ensured over a long period of time.

In a structure which aims for higher density by providing the ink pooling chamber 38 at the opposite side of the pressure chambers 50 with the vibrating plate 48 therebetween and by providing the piezoelectric elements 46 at the ink pooling chamber 38 side with the vibrating plate 48 therebetween, the piezoelectric elements 46 are overlaid by the ink filled in the ink pooling chamber 38. Therefore, in such a structure, both the ink-resistance and the moisture-resistance are improved particularly effectively, by the present invention.

Because the film thickness of the low water permeable insulating film 80 can be made thin and the resin insulating film 82 is flexible, they do not impede the displacement of the piezoelectric elements 46. Further, both the ink-resistance and the moisture-resistance can be improved simultaneously without using an expensive metal which would conventionally be used in order to improve the moisture-resistance.

Note that description has been given of an embodiment in which the protective film, which is formed from the low water permeable insulating film 80 and the resin insulating film 82, is provided. However, an embodiment may be employed in which only the low water permeable insulating film 80 is provided as the protective layer on the surfaces (the ink pooling chamber 38 side surfaces) of the piezoelectric elements 46. In this way, as described above, sufficient moisture-resistance is imparted to the piezoelectric elements, and good reliability can be ensured over a long period of time.

In the above description, the piezoelectric element substrate 70 and the flow path substrate 72, which structure the inkjet recording head 32, are manufactured respectively on the supporting substrates 76, 100 which are always hard. In these manufacturing processes, a method is used in which the supporting substrates 76, 100 are removed at the point in time when they become unnecessary. Due to this method, the inkjet recording head 32 is extremely easy to manufacture. Note that the rigidity of the manufactured (completed) inkjet recording head 32 is ensured, because the inkjet recording head 32 is supported by the top plate 40 (the top plate 40 is used as a supporting body).

Moreover, in the inkjet recording device 10 of the above-described embodiment, the inkjet recording units 30 of the respective colors of black, yellow, magenta, and cyan are respectively installed in the carriage 12, and on the basis of image data, ink drops are selectively ejected from the inkjet recording heads 32 of these respective colors such that a full-color image is recorded on the recording sheet P. However, the inkjet recording in the present invention is not limited to the recording of characters or images onto the recording sheet P.

Namely, the recording medium is not limited to sheets, and the liquid which is ejected is not limited to ink. For example, the inkjet recording head 32 relating to the present invention can be applied to liquid drop jetting devices in general which are used industrially, such as in producing color filters for displays by ejecting ink onto a high polymer film or glass, or in forming bumps for packaging parts by ejecting solder in a welded state onto a substrate, or the like.

Further, in the inkjet recording device 10 of the above-described embodiment, a Partial Width Array (PWA) having the main scanning mechanism 16 and the subscanning mechanism 18 has been described as an example. However, the inkjet recording in the present invention is not limited to the same, and may be so-called Full Width Array (FWA) which corresponds to the width of the sheet. Because the present invention is effective in realizing a high-density nozzle array, it is ideal for FWA which necessitates single-pass printing.

EXAMPLES

Structure 1 is produced in which, in the above-described embodiment, the piezoelectric elements 46 are covered by a protective film in which are successively layered the low water permeable insulating film 80, which has a dangling bond density of greater than or equal to $1 \times 10^{18}$ cm$^{-3}$, and the resin insulating film 82. Structure 2, in which the piezoelectric elements 46 are covered only by the resin insulating film 82, is produced for comparison with Structure 1. Structure 1 and Structure 2 are evaluated as follows. In addition, Structure 3, which is covered by a protective film in which are successively layered the low water permeable insulating film 80, which has a dangling bond density of less than $1 \times 10^{18}$ cm$^{-3}$, and the resin insulating film 82, is prepared and evaluated in the same way.

Structure 1

In the following manner, the low water permeable insulating film 80, which has a dangling bond density of greater than or equal to $1 \times 10^{18}$ cm$^{-3}$, and the resin insulating film 82 are successively layered so as to cover the piezoelectric elements 46.

The low water permeable insulating film 80 (SiO$_x$ film) is formed to a film thickness of 0.5 μm by the ECR CVD method under the following conditions: O$_2$/SiH$_4$ ratio=1.2, microwave power=300 W, formation temperature=100° C., gas pressure=0.13 Pa. The density of dangling bonds in the film during the formation process is $5 \times 10^{18}$ cm$^{-3}$. Next, a polyimide resin film is formed to a film thickness of 1 μm by coating, and is subjected to a curing heat treatment in N$_2$ gas at 300° for 20 minutes. The ink-resistance of the polyimide material is greatly improved by this thermal processing.

Structure 2

In the following manner, the resin insulating film 82 is layered and covered on the piezoelectric elements 46.

A polyimide resin film is formed to a film thickness of 1 μm by coating, and is subjected to a curing heat treatment in N$_2$ gas at 300° for 20 minutes. The ink-resistance of the polyimide material is greatly improved by this thermal processing. The polyimide resin film is formed under the same conditions as the polyimide resin film in the above-described Structural Example 1.

Structure 3

The low water permeable insulating film 80, which has a dangling bond density of less than $1 \times 10^{18}$ cm$^{-3}$, and the resin insulating film 82 are successively layered so as to cover the piezoelectric elements 46.

An insulating film (SiO$_x$N$_y$ film) is formed to a film thickness of 0.5 μm by the RF plasma CVD method under the following conditions: N$_2$O/SiH$_4$ ratio=45, RF power=120 W, formation temperature=300° C., gas pressure=130 Pa. The density of dangling bonds in the film at this time is $1 \times 10^{17}$ cm$^{-3}$. Next, a polyimide resin film is formed to a film thickness of 1 μm by coating, and is subjected to a curing heat treatment in N$_2$ gas at 300° for 20 minutes. The ink-resistance of the polyimide material is greatly improved by this thermal processing. The polyimide resin film is formed under the same conditions as the polyimide resin films in the above-described Structural Examples 1 and 2.

Evaluation

The following two experiments are conducted by using inkjet heads produced by the above-described three structures.

1. Moisture-Resistance Test: An energizing pulse test is carried out under environmental conditions of humidity of 85% and temperature of 50° C. (ink is not filled-in). Because the piezoelectric bodies are not sealed, they are directly exposed to the aforementioned environmental conditions. The criterion for judging the lifespan is the number of pulses at the time when the piezoelectric characteristic (the electrostatic capacity) drops 20% from its initial value.

2. Ink-Resistance Test: After the head is immersed for a predetermined time period in ink of a pH of 9 and a temperature of 65° C., the corrosion of the piezoelectric element portions is observed by an optical microscope and by a scanning electron microscope. The stage when the protective film (the moisture-resistant insulating layer and the polyimide resin) on the piezoelectric element has disappeared and the electrode has been exposed is judged to be the lifespan.

Results of Evaluation

With Structure 1, in the moisture-resistance test, even after the energizing test of $1\times10^{10}$ pulses, there is hardly any deterioration of the characteristic, and the characteristic is kept within the predetermined range. Further, in the ink-resistance test, even after being left to stand for 400 hours, no deterioration in the protective film (the polyimide film) is seen.

With Structure 2, in the moisture-resistance test, after the energizing test of $5\times10^{6}$ pulses, a 20% deterioration in the characteristic is observed. On the other hand, in the ink-resistance test, even after being left to stand for 400 hours, no deterioration in the protective film (the polyimide film) is seen.

With Structure 3, in the moisture-resistance test, after the energizing test of $2\times10^{7}$ pulses, a 20% deterioration in the characteristic is observed. On the other hand, in the ink-resistance test, even after being left to stand for 400 hours, no deterioration in the protective film (the polyimide film) is seen.

From these results of evaluation, it can be understood that Structure 1 is superior with respect to both ink-resistance and moisture-resistance, because it is covered by the low water permeable insulating film 80 and the resin insulating film 82. In contrast, in Structure 2, although the ink-resistance is improved, the moisture-resistance is not improved.

Further, in Structure 3, it can be understood that, although the piezoelectric elements are covered by the low water permeable insulating film 80 and the resin insulating film 82, sufficient moisture-resistance cannot be imparted because the dangling bond density of the low water permeable insulating film 80 is low.

What is claimed is:

1. An inkjet recording head comprising:
   a nozzle ejecting ink drops;
   a pressure chamber which communicates with the nozzle and in which ink is filled;
   a vibrating plate structuring a portion of the pressure chamber;
   an ink pooling chamber for pooling ink to be supplied to the pressure chamber via an ink flow path, the ink flow path passing through a through-hole formed in the vibrating plate; and
   a piezoelectric element displacing the vibrating plate, said ink flow path bypasses said piezoelectric element;
   the piezoelectric element including:
      a piezoelectric body; and
      two electrodes between which the piezoelectric body is interposed,
      wherein the piezoelectric element is covered by a low water permeable insulating film serving as a protective film.

2. The inkjet recording head of claim 1, wherein the low water permeable insulating film has a dangling bond density of no lower than $1\times10^{18}$ cm$^{-3}$.

3. The inkjet recording head of claim 1, wherein the low water permeable insulating film is formed by an ECR (Electron Cyclotron Resonance) method.

4. The inkjet recording head of claim 1, wherein the low water permeable insulating film is formed by one of a silicon oxide film, a silicon nitride film, and a silicon oxynitride film.

5. The inkjet recording head of claim 1, further comprising a first wire, which is connected to one of the electrodes, wherein the protective film covers the first wire and functions as an interlayer insulating film.

6. The inkjet recording head of claim 1, further comprising:
   a second wire, which is connected to one of the electrodes and provided on at least a portion of the protective film; and
   another second resin insulating film, which is provided so as to cover the second wire.

7. The inkjet recording head of claim 6, wherein the second resin insulating film is structured by a resin film which is of the same type as the resin insulating film provided as the protective film.

8. An inkjet recording head comprising:
   a nozzle ejecting ink drops;
   a pressure chamber which communicates with the nozzle and in which ink is filled;
   a vibrating plate structuring a portion of the pressure chamber;
   an ink pooling chamber for pooling ink to be supplied to the pressure chamber via an ink flow path, the ink flow path passing through a through-hole formed in the vibrating plate; and
   a piezoelectric element displacing the vibrating plate, said ink flow path bypasses said piezoelectric element;
   the piezoelectric element including:
      a piezoelectric body; and
      two electrodes between which the piezoelectric body is interposed,
      wherein the piezoelectric element is covered by a protective film in which a low water permeable insulating film and a resin insulating film are successively layered.

9. The inkjet recording head of claim 8, wherein the resin insulating film is structured by one of a polyimide resin film, a polyamide resin film, an epoxy resin film, a polyurethane resin film, and a silicone resin film.

10. The inkjet recording head of claim 8, wherein the low water permeable insulating film has a dangling bond density of no lower than $1\times10^{18}$ cm$^{-3}$.

11. The inkjet recording head of claim 8, wherein the low water permeable insulating film is formed by an ECR (Electron Cyclotron Resonance) method.

12. The inkjet recording head of claim 8, wherein the low water permeable insulating film is formed by one of a silicon oxide film, a silicon nitride film, and a silicon oxynitride film.

13. The inkjet recording head of claim 8, wherein a first wire, which is connected to one of the electrodes, is provided, and the protective film covers the first wire and functions as an interlayer insulating film.

14. The inkjet recording head of claim 8, wherein a second wire, which is connected to one of the electrodes, is provided on at least a portion of the protective film, and another, second resin insulating film covers the second wire.

15. The inkjet recording head of claim 14, wherein the second resin insulating film is structured by a resin film which is the same as the resin insulating film provided as the protective film.

16. The inkjet recording head of claim 6, wherein a portion of the protective film at which the second wire is not provided is exposed to the ink pooling chamber.

17. The inkjet recording head of claim 14, wherein a portion of the protective film at which the second wire is not provided is exposed to the ink pooling chamber.

18. An inkjet recording device comprising the inkjet recording head of claim 1.

19. An inkjet recording device comprising the inkjet recording head of claim 8.

* * * * *